(12) United States Patent
Nakayama et al.

(10) Patent No.: US 8,735,816 B2
(45) Date of Patent: May 27, 2014

(54) STANDARD MEMBER FOR CALIBRATION AND METHOD OF MANUFACTURING THE SAME AND SCANNING ELECTRON MICROSCOPE USING THE SAME

(75) Inventors: Yoshinori Nakayama, Sayama (JP); Takashi Tase, Tokorozawa (JP); Jiro Yamamoto, Tachikawa (JP); Osamu Inoue, Kodaira (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 13/995,627

(22) PCT Filed: Dec. 26, 2011

(86) PCT No.: PCT/JP2011/007245
§ 371 (c)(1),
(2), (4) Date: Jun. 19, 2013

(87) PCT Pub. No.: WO2012/090465
PCT Pub. Date: Jul. 5, 2012

(65) Prior Publication Data
US 2013/0299699 A1      Nov. 14, 2013

(30) Foreign Application Priority Data

Dec. 28, 2010 (JP) ................................. 2010-291517

(51) Int. Cl.
*G01N 23/00* (2006.01)
*G21K 7/00* (2006.01)

(52) U.S. Cl.
USPC .......... 250/307; 250/310; 250/252.1; 257/48; 257/429

(58) Field of Classification Search
USPC .................. 250/307, 310, 252.1; 257/48, 429
See application file for complete search history.

(56) References Cited

U.S. PATENT DOCUMENTS

2008/0251868 A1* 10/2008 Nakayama et al. ........... 257/429
2011/0210250 A1*  9/2011 Nakayama et al. ........... 250/310

FOREIGN PATENT DOCUMENTS

JP        2008-261689 A    10/2008
WO    WO 2010/052840 A1    5/2010

* cited by examiner

*Primary Examiner* — Jack Berman
*Assistant Examiner* — Meenakshi Sahu
(74) *Attorney, Agent, or Firm* — Miles & Stockbridge P.C.

(57) ABSTRACT

A standard member for automatically, stably, and highly accurately performing magnification calibration used in an electron microscope, the standard member including, on the same plane, a multilayer film cross section formed by alternately laminating materials different from each other, a plurality of first mark patterns arranged across a first silicon layer and in parallel to the multilayer film cross section, at least a pair of second mark patterns arranged across a second silicon layer thicker than the first silicon layer on the opposite side of the first mark patterns with respect to the multilayer film cross section and in parallel to the multilayer film cross section, and a silicon layer arranged on the outer side of the first mark patterns and the second mark patterns with respect to the multilayer film cross section.

18 Claims, 20 Drawing Sheets

B-B' CROSS SECTION

STANDARD MEMBER FOR CALIBRATION AND METHOD OF MANUFACTURING THE SAME AND SCANNING ELECTRON MICROSCOPE USING THE SAME

TECHNICAL FIELD

The present invention relates to a standard sample for calibrating a scanning electron microscope, a method of manufacturing the same and a scanning electron microscope using the same.

BACKGROUND ART

In recent years, refining of semiconductor element is progressing increasingly and more highly accurate linewidth management is necessary. Therefore, in a semiconductor manufacturing site, linewidth management is performed using an electron beam measuring device based on a scanning electron microscope. Measuring accuracy of the linewidth management is determined by magnification calibration accuracy of the scanning electron microscope.

However, when measurement at higher magnification is performed according to the refining of semiconductor elements, since the visual filed of the scanning electron microscope is reduced to a narrow region, fineness equal to or higher than the fineness of a semiconductor pattern is requested for a pattern of a standard sample for performing magnification calibration. To meet the request, as a calibration sample having fineness equal to or smaller than a pitch linewidth of 100 nm, multilayer film samples disclosed in PTL 1 and PTL 2 are proposed.

CITATION LIST

Patent Literature

PTL 1: JP-A-2008-261689
PTL 2 WO2010/052840

SUMMARY OF INVENTION

Technical Problem

However, when the calibration sample of PTL 1 is used for the magnification calibration of the scanning electron microscope, problems explained below occur.

When a cross-section sample is used as a calibration sample, a substrate surface section where a multilayer film pattern is present changes to a substrate end section and a step is formed when a cross section is erected. The scanning electron microscope used for a semiconductor inspection applies a voltage to a sample to control an acceleration voltage of an electron beam. Therefore, if the step is present, a local surface electric field distribution occurs in a step section and astigmatism occurs. As a result, calibration accuracy is deteriorated. For example, if a step equal to or larger than 300 μm is present within 1 mm near a calibration section, the electron beam is sometimes defocused because of the influence of the astigmatism.

In order to solve this problem, as disclosed in PTL 2, a method of joining the same cross-section samples is conceived. Such a joined sample has problems explained below.

When two substrates are joined, the two substrates are joined across a multilayer film pattern side in order to eliminate a step around a multilayer film section. In this case, if unevenness is present on a joined surface of the both substrates, a gap is formed in the joined surface, bonding strength falls, and the substrates peel. In particular, if a mark of linear convexo or concave patterns continuous in a direction perpendicular to a cross section as disclosed in PTL 1 is formed in the joined surface, there is a risk of the peeling. A bonding characteristic is substantially affected depending on the size and the number of the concave or convex patterns.

For example, in some case, the joining cannot be performed if a pattern convex section is higher than a flat section or when a contact area of the flat section is, for example, equal to or smaller than 50%. As a method of preventing this influence, a method of embedding the concave or convex patterns with a thin formed film and then planarizing the thin formed film with polishing is conceivable. In this case, there is a limit in the thickness of the thin formed film capable of embedding the concave or convex patterns. It is difficult to embed concave or convex patterns having thickness equal to or larger than 10 μm. Therefore, it is necessary to set the size of the concave or convex patterns to be equal to or smaller than 10 μm in order to realize satisfactory substrate joining.

As a second problem, when magnification calibration of the scanning electron microscope is performed using a calibration pattern, there is a problem in that carbide deposition called contamination is caused on the surface of the calibration pattern by electron beam scanning and calibration pattern linewidth fluctuation occurs. In order to realize highly accurate calibration, it is necessary to select a calibration pattern section without electron beam scanning or with a small number of times of electron beam scanning in the past. Therefore, in order to realize as large a number of times of calibration using one sample, it is necessary to provide a region of a calibration pattern section. In a calibration pattern to which a multilayer film cross section is applied, continuous linear line-and-space patterns extending over length of several centimeters are formed. A calibration pattern section without electron beam scanning or with a small number of times of electron beam scanning in the past is selected out of the line-and-space patterns and calibration is performed from a measured pitch linewidth. Therefore, in order to specify a calibration place, a mark corresponding to the calibration place is essential. The mark of the linear concave or convex patterns continuous in the direction perpendicular to the cross section as disclosed in PTL 1 is devised. A measurement magnification of a linewidth of a pattern desired to be measured is one hundred times or larger. The size of an electron beam scanning range during the calibration is equal to or smaller than 5 μm. Therefore, it is necessary to set the size of the mark corresponding to the calibration place for specifying a calibration position to be equal to or smaller than 5 μm.

Third, when magnification calibration of the scanning electron microscope is automatically performed, it is necessary to accurately scan an electron beam on a selected calibration pattern. Since the size of an electron beam scanning range during calibration is about 5 μm, electron beam scanning positioning accuracy on the selected calibration pattern needs to be equal to or smaller than 5 μm. In this way, the size of a mark pattern for specifying a position needs to be as small as 5 μm or less.

On the other hand, the size of a standard sample used for calibration is size equal to or larger than 1 cm square because the standard sample includes continuous linear line-and-space patterns extending over 1 cm or more. Because of a fixing error during sample mounting or a coordinate error of a stage, it is difficult to search for and specify the specific mark equal to or smaller than 5 μm in a calibration sample member equal to or larger than 1 cm square.

Even if the mark equal to or smaller than 5 μm can be detected, it is difficult to recognize a specific mark from a mark group arrayed at a fixed interval. Therefore, a large mark pattern of about several tens micrometers that can be recognized at low magnification of about several hundred times is necessary. However, it is difficult to form the mark pattern on a joined surface because of a joining characteristic.

As a fourth problem, since the magnification of the scanning electron microscope is substantially different depending on a height position of a sample surface, it is necessary to perform magnification calibration in a height position same as a pattern surface to be measured at accuracy within several hundred micrometers. A pattern height position to be measured is present on a wafer. When the wafer is fixed on a stage of the scanning electron microscope, reproducibility of the height is fit within several hundred micrometers. Therefore, it is necessary to adjust in advance the height position of the calibration sample to the upper surface height of the wafer fixed to the stage at accuracy within several hundred micrometers.

However, in the case of a divided cross-sectional shape calibration member, since it is difficult to divide the calibration member at the accuracy within several hundred micrometers, it is necessary to polish the calibration member for height adjustment after the division. However, a large mark pattern of about several tens micrometers is necessary on the cross-sectional shape calibration member including the polishing step.

It is an object of the invention to provide a standard member with which magnification calibration used in an electron microscope can be performed at high accuracy and a method of manufacturing the same and a scanning electron microscope using the same.

Solution to Problem

A standard member for calibration according to the invention is a standard member for calibration for calibrating a scanning electron microscope including: a multilayer film cross section formed by alternately laminating materials different from each other; a plurality of first mark patterns arranged across a first silicon layer and in parallel to the multilayer film cross section; at least a pair of second mark patterns arranged across a second silicon layer thicker than the first silicon layer on the opposite side of the first mark patterns with respect to the multilayer film cross section and in parallel to the multilayer film cross section; and a silicon layer arranged on the outer side of the first mark patterns and the second mark patterns with respect to the multilayer film cross section, the multilayer film cross section, the first mark patterns, the second mark patterns, and the silicon layer being provided on the same plane.

A method of manufacturing a standard member for calibration according to the invention is a method of manufacturing a standard member including: a step of alternately laminating materials different from each other on a first silicon substrate surface to manufacture a first substrate, which is a multilayer film cross section on which a silicon layer is formed as a top layer; a step of forming a plurality of groove patterns, which are first mark patterns, on a second silicon substrate surface, forming a cross-shaped groove pattern, which is a third mark pattern, on the outer side with respect to a row of the groove patterns, and, after forming an oxide film over the entire second silicon substrate surface, manufacturing a second substrate that forms a silicon layer as a top layer; a step of slicing out the first substrate into size smaller than the second substrate and joining the silicon layer, which is the top layer of the first substrate, the silicon layer, which is the top layer of the second substrate, such that the third mark pattern is exposed; a step of forming a plurality of groove patterns, which are second mark patterns, on the first substrate side of the joined substrate with reference to a position of the third mark pattern; a step of slicing out the joined substrate with reference to the position of the third mark pattern; a step of erecting the multilayer film cross section, the first mark patterns, and the second mark patterns of the sliced-out joined substrate on a substrate for position fixing to appear on an upper surface and sticking together the first silicon substrate surface and the second silicon substrate to be held by retaining substrates made of silicon from both sides; a step of polishing the cross section of a stuck joined substrate to set the height of the cross section of the stuck joined substrate to desired height from the bottom surface of the substrate for position fixing; and a step of forming a line pattern through material selective etching of the cross section of the joined substrate and forming the first mark patterns, which are position specifying patterns, as convexo-concave patterns through the material selective etching.

Advantageous Effects of Invention

According to the invention, it is possible to provide a standard member for calibration capable of performing accurate magnification calibration and capable of always performing stable magnification calibration and a method of manufacturing the same and a scanning electron microscope using the same.

DESCRIPTION OF EMBODIMENTS

Figure 1:
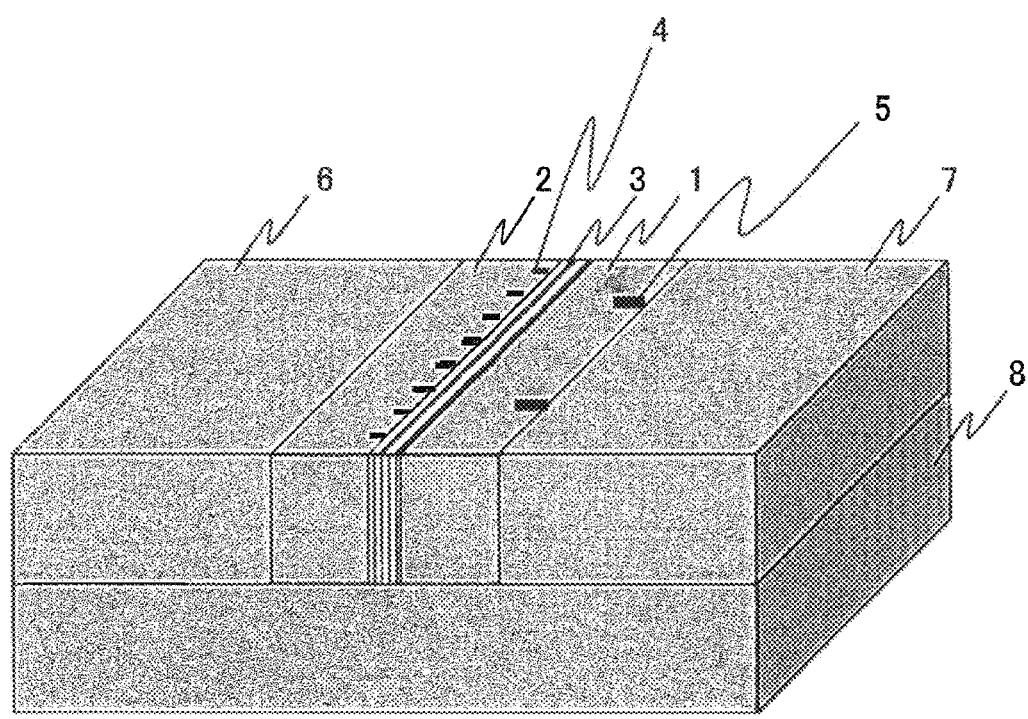
FIG. 1 is a schematic diagram of a standard member according to a first embodiment of the invention.

According to a representative embodiment of the invention, a first silicon substrate including a magnification calibration pattern consisting of a periodic pattern of a fixed pitch linewidth and a second silicon substrate, which is larger than the first silicon substrate, including a magnification calibration pattern, on the surface of which a plurality of first mark patterns consisting of concaves and convexes and one or a plurality of third mark patterns associated with the first mark patterns in a coordinate positional relation are manufactured, are opposed to each other and joined by normal temperature joining to expose the third mark patterns. Subsequently, a second mark pattern is manufactured as a linear groove pattern by dicing on the first silicon substrate side of a joined silicon substrate surface with reference to the third mark patterns exposed on joined surface of a joined substrate. Further, the joined substrate is divided by dicing with reference to the third mark patterns to be orthogonal to the linear groove pattern. Further, divided sample fragments are mounted on a chip and polished to be flat. Further, one of periodic patterns of a fixed pitch linewidth is selectively etched. Consequently, a standard member for calibration is obtained that includes, on a flat sample surface without a step, concave or convex periodic patterns of a fixed pitch linewidth and is mounted with a large mark in which a calibration pattern position can be detected by an optical microscope and a small mark detectable by an electron microscope.

A convexo-concave period of a laminated section of the standard member for calibration is calculated by X-ray diffraction in advance and the standard member for calibration is mounted on the electron microscope, A result obtained by measuring the convexo-concave period is compared with a laminating period calculated by the X-ray diffraction, whereby magnification calibration of the scanning electron microscope is performed.

Characteristic configuration examples included in the invention are listed below.

(1) A standard member for calibration according to the invention is a standard member for calibration for calibrating, from information concerning secondary electron or reflection electron beam generated by scanning an incident electron beam on an observation region on an object to be inspected, a scanning electron microscope that measures a pattern in the observation region. The standard member for calibration is characterized in that another substrate is arranged by joining without a gap at an end of a substrate having convexo-concave period patterns of a fixed pitch linewidth, whereby, since convexo-concave period pattern sections of the fixed pitch linewidth are formed in a flat section, a local surface electric field distribution due to a step does not occur and it is possible to stably perform magnification calibration with the convexo-concave period patterns of the fixed pitch linewidth.

(2) The standard member for calibration having the configuration explained above is characterized by including a pattern region consisting of a convexo-concave period of a perpendicular cross section of a laminated substrate manufactured by subjecting a substrate cross section, in which a multilayer film is laminated, to laminating material selective etching.

(3) The standard member for calibration is characterized in that a first mark pattern for specifying a calibration place at a fixed interval in a direction orthogonal to the periodic pattern is arranged near the convexo-concave period patterns of the fixed pitch linewidth and a second mark pattern, a position coordinate of which is associated with the first mark pattern, larger than the first mark pattern is arranged on the rear surface side of the joined surface of the joined substrate, whereby it is possible to select, out of the convexo-concave period patterns of the fixed pitch linewidth formed in a long region, a calibration pattern section without electron beam scanning or with a small number of times of electron beam scanning in the past and performing calibration according to the two kinds of large and small mark patterns.

(4) The standard member for calibration having the configuration explained above is characterized in that a pitch linewidth of convexo-concave patterns of the substrate, in which the multilayer film is laminated, is calculated by X-ray diffraction.

(5) A method of manufacturing a standard member for calibration according to the invention is characterized by including a step of joining two substrates without using an adhesive in order to arrange another substrate without a gap at an end of a substrate having convexo-concave period patterns of a fixed pitch linewidth. The method is characterized by including, as the joining, a joining step of any one of a step of directly joining silicon surfaces each other or oxide film surfaces each other through heating at about 1000° C., an anodic joining step of heating and joining an oxide film surface of any one of substrates on one side and a silicon surface of any one of the substrate while applying a voltage of several hundred volts thereto, and a normal temperature joining step of joining silicon surfaces each other or oxide film surfaces each other after activating the surfaces with an ion beam in a vacuum.

(6) The method of manufacturing the standard member for calibration explained above is characterized by including a step of forming a substrate, on which a first mark pattern for specifying a calibration place during the joining of the two substrates is formed, larger than a substrate on one side and arranging a third mark pattern, a positional relation of which is associated with the first mark pattern, in a peripheral section of a surface joined with the substrate on which the first mark pattern is formed and a step of aligning and joining the two substrates to join a first mark pattern section to the substrate on the one side during the joining of the two substrates and expose a third mark pattern section. Further, the method is characterized by including a step of forming a linear groove pattern, desirably a V-shape groove pattern to be the second mark pattern on a substrate surface on the opposite side of a joined surface of a substrate joined to a first mark substrate with the exposed third mark pattern set as a reference coordinate, a step of dividing the substrate joined with the third mark pattern set as the reference coordinate into a plurality of calibration member pieces through dicing, and a step of adjusting the height of the calibration member pieces through polishing.

(7) The method of manufacturing the standard member for calibration explained above is characterized by including a step of selectively etching one of the periodic patterns of the fixed pitch linewidth to thereby calculating in advance, through X-ray diffraction, a pitch linewidth of a standard member without a step, without damage to a multilayer film pattern, and having the convexo-concave period patterns of the fixed pitch linewidth. Magnification calibration of an electron microscope is performed to reduce, when the pitch linewidth is compared with a measurement result in the electron microscope, a difference between the pitch linewidth and the measurement result to nearly zero.

Embodiments of the invention are explained in detail below with reference to the drawings.

First Embodiment

Figure 2:
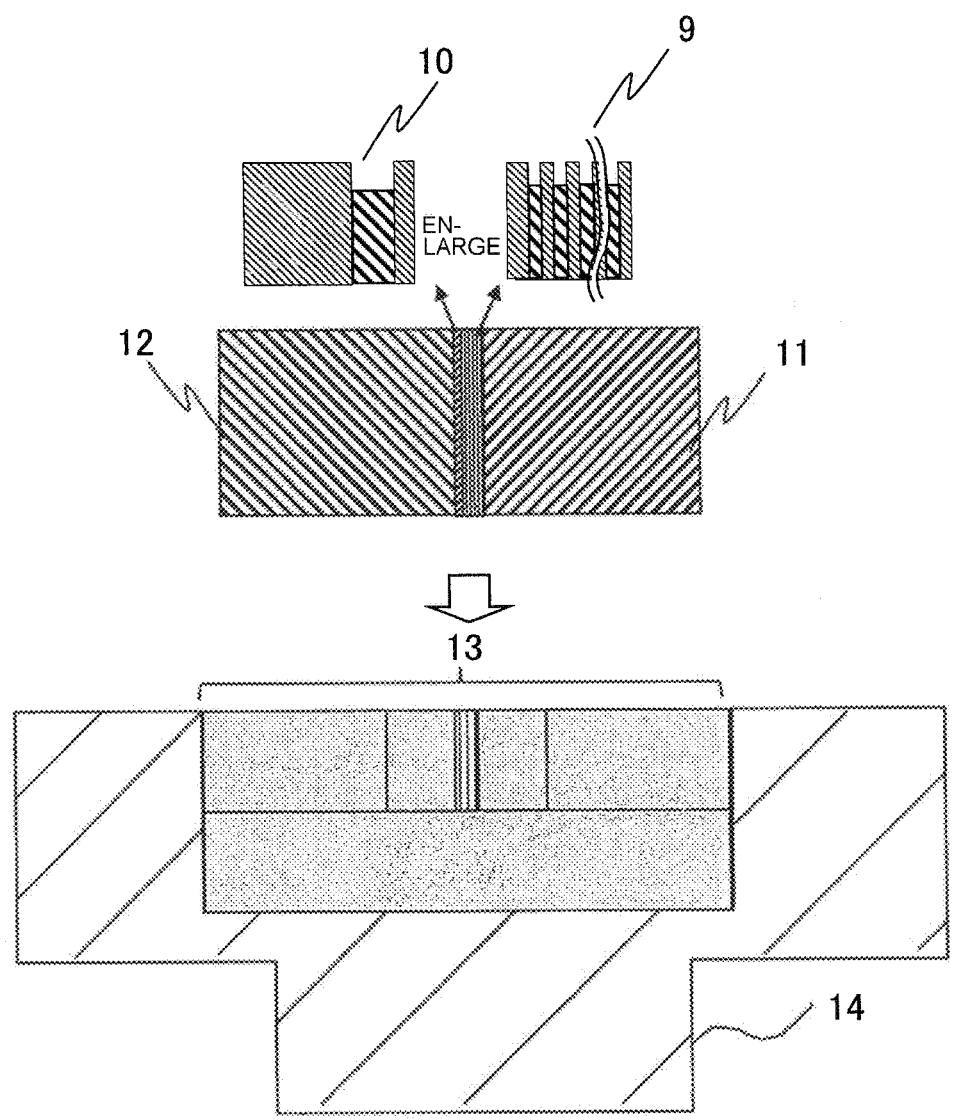
FIG. 2 is an overall diagram showing the standard member and a retaining holder according to the first embodiment of the invention.

A first embodiment of the invention is explained with reference to FIGS. 1 to 13. First, FIGS. 1 and 2 are schematic diagrams of a standard member for calibration in the first embodiment of the invention. FIG. 1 is a general view showing an entire calibration member, FIG. 2 is a sectional view in which the calibration member is mounted on a retaining holder 14, which is a retaining table.

A standard member for calibration 13 is configured by combining, with a plurality of substrates for fixing 6, 7, 8, a magnification calibration pattern 3 including a laminated structure 9 consisting of a laminated convexo-concave period manufactured by subjecting cross sections of first substrates 1, 11, in which multilayer films are laminated, to laminating material selective etching and second substrates 2, 12 including first mark patterns 4, 10 for specifying a calibration position. A pair of second mark patterns 5 is formed on surfaces on the opposite side of multilayer film forming sections of the first substrates 1, 11 in which the multilayer films are laminated. The standard member for calibration is mounted on the retaining holder 14 made of aluminum. For example, the standard member for calibration is a laminated structure 16 of a silicon oxide film layer 19 and a silicon layer 20 formed on the surfaces of silicon substrates 15, 17, 21 as shown in FIG. 4. On the other hand, the second substrate 12 having the first mark pattern 4 for specifying a calibration position includes groove patterns 23, 27 obtained by etching a substrate section linearly in a direction perpendicular to the paper surface, which has width of 0.3 μm, at a pitch of 10 μm and depth of 0.3 μm in a direction horizontal to the surface of a substrate 22 as shown in FIG. 5.

In this way, the standard member for calibration 13 includes a joined substrate obtained by joining the first substrate (a sample fragment) 11 including the multilayer film 16, in which different materials are alternately laminated on a substrate surface, and the second sample fragment 12 having the first mark patterns 4, 10 for specifying a calibration position.

Figure 12:
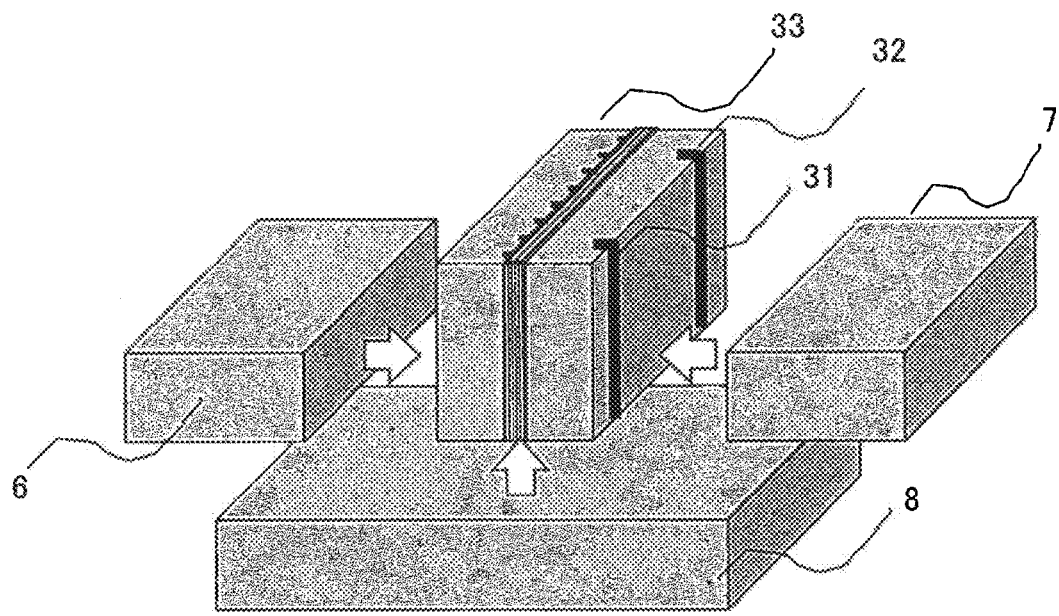
FIG. 12 is a diagram for explaining a calibration member assembling process for the standard member in the first embodiment of the invention.
Figure 13:
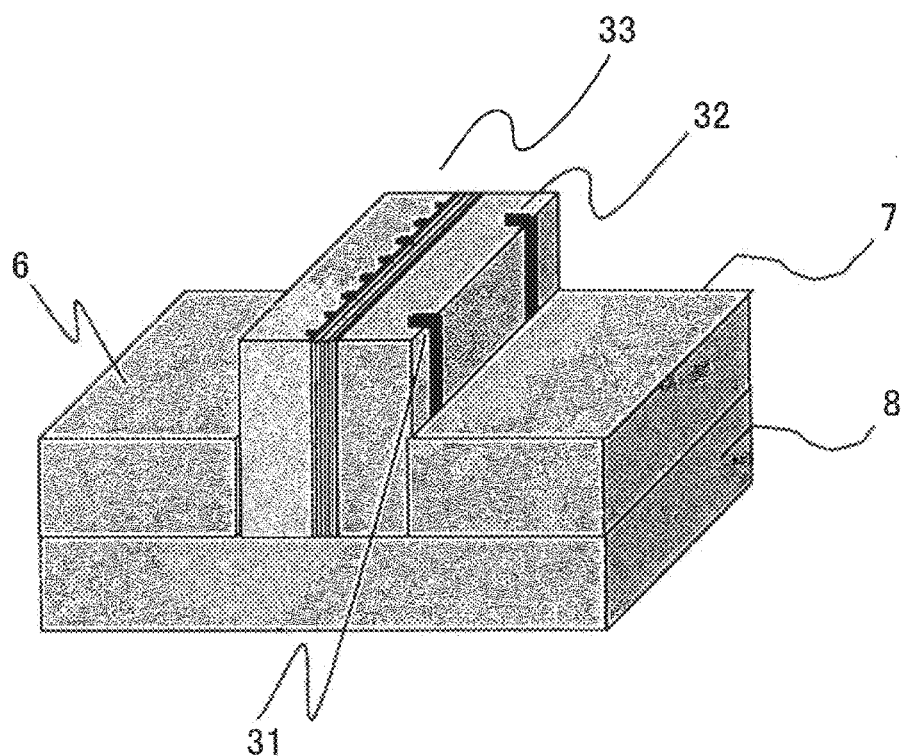
FIG. 13 is a diagram for explaining the calibration member assembling process for the standard member in the first embodiment of the invention.

A cross section of the joined two members is formed by dicing and polishing as indicated by the standard member for calibration shown in FIGS. 1, 12, and 13. The height of the top surface of the cross section is formed at accuracy of a difference equal to or smaller than 100 μm from the height of a pattern section of a wafer that should be measured when the member is fixed to the retaining holder 14 and mounted on an electron microscope.

Figure 6:
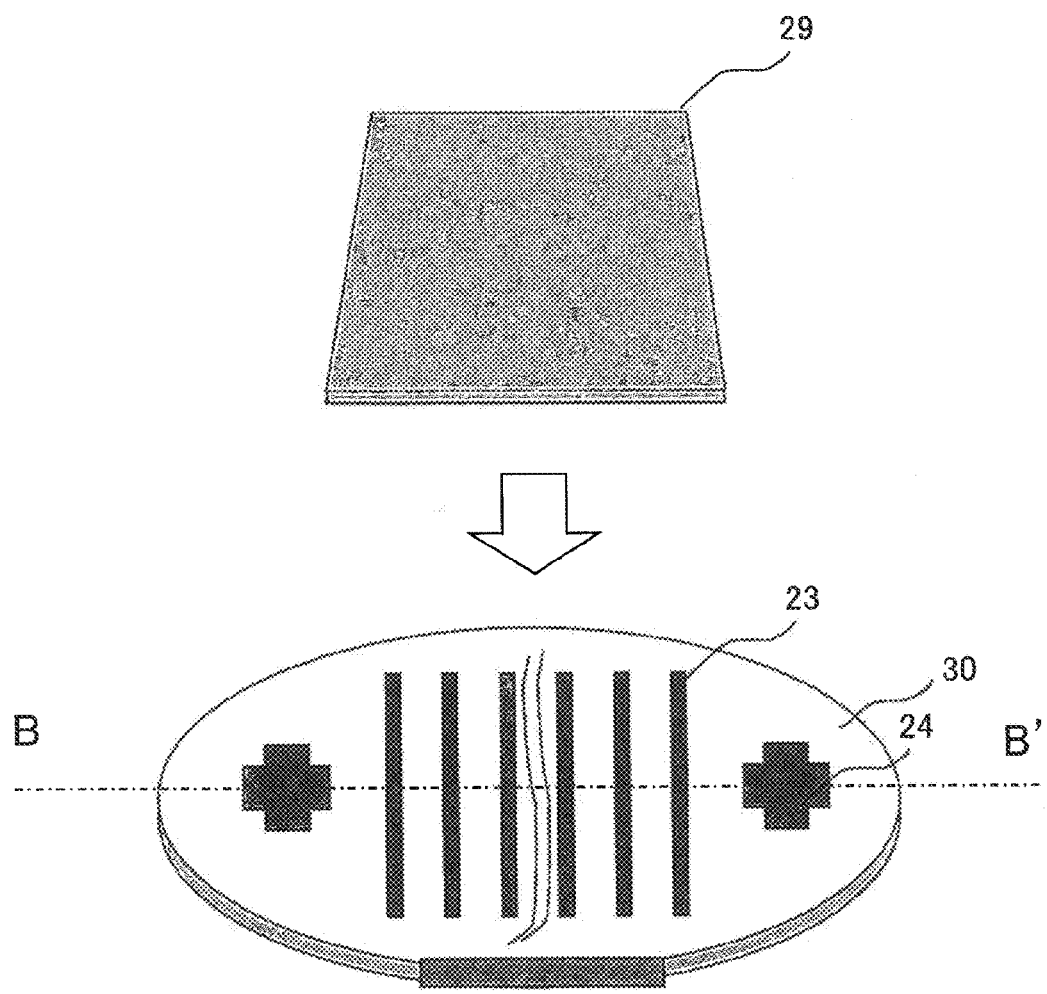
FIG. 6 is a diagram showing a process of wafer joining in the first embodiment.

Note that, in the invention, joining means a bonding method in which a discontinuous boundary of a top surface atom array and the atmosphere extending across the atmosphere before the joining in an atom array state of the surfaces of two opposed substrates 29, 30 shown in FIG. 6 disappears after the joining and an atom array state of the top surfaces of the two opposed substrates changes to a continuous atom array state.

Therefore, the standard member for calibration 13 is in a state in which two substrate surfaces are continuous, an interface is absent on a joined surface, and the joined surface cannot be specified in a joined section for connecting a calibration mark pattern region and the first mark patterns.

Figure 11:
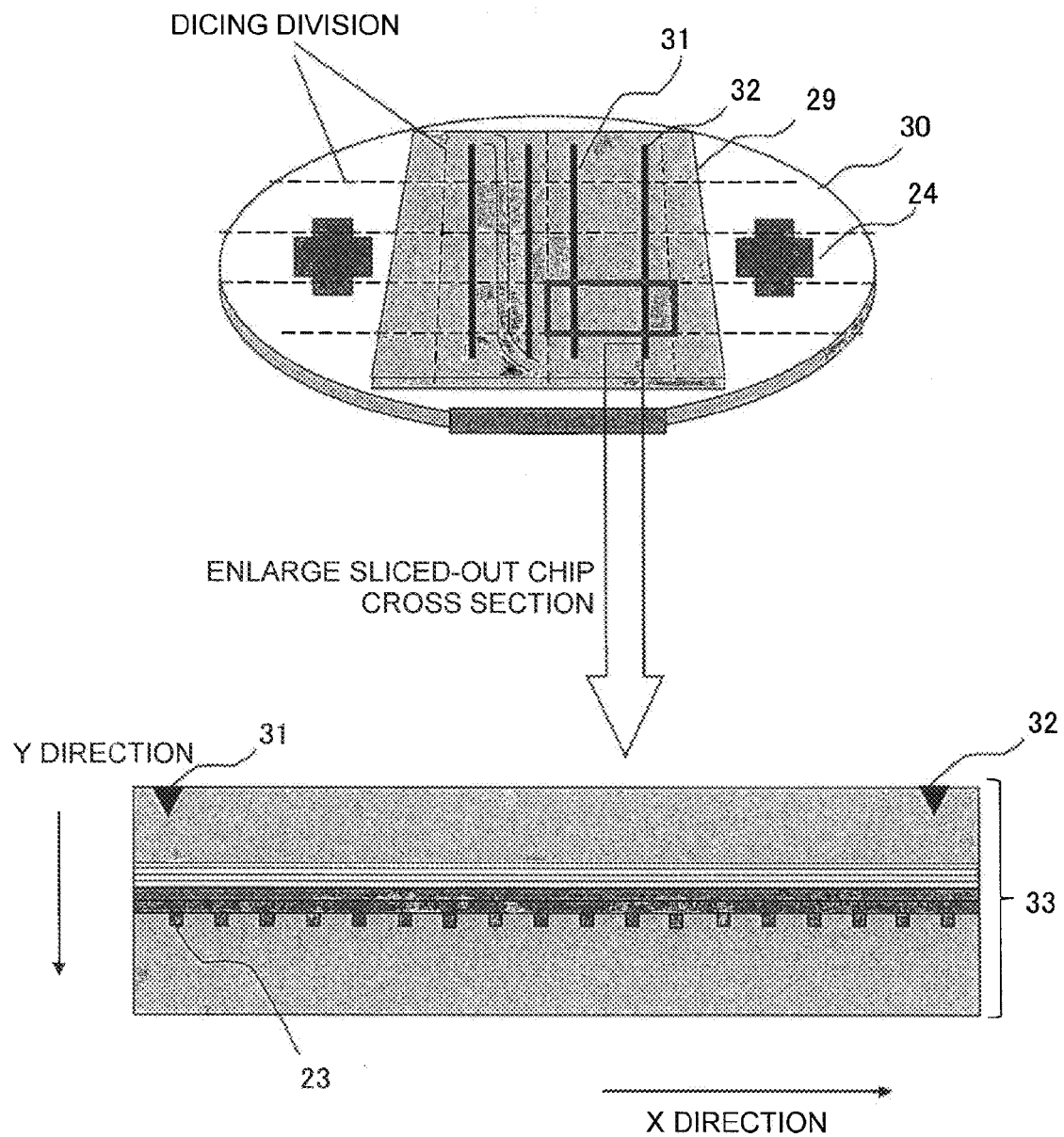
FIG. 11 is a diagram for explaining a calibration member chip slicing-out process for the standard member in the first embodiment of the invention.

The standard member for calibration 13 is used for calibrating, from information concerning secondary electron or reflection electrode intensity generated by scanning an incident electron beam in an observation region on a measurement sample, a scanning electron microscope that measures a pattern in the observation region. The first mark patterns 4, 23, 27 are arranged at substantially the same height as a calibration pattern section to be adjacent to the position of 1 μm in a joined surface direction (a y direction) from the center of a calibration pattern section laminated layer 37 at a pitch of a fixed interval of 10 μm in a longitudinal direction of a standard member for calibration 36 (an x direction) as shown in FIGS. 1 and 11. The second mark patterns 5, 31, 32 are linear groove patterns arranged in a direction perpendicular to a paper surface, which has width of 30 μm, at depth of 30 μm in two places on a surface opposite to a joined surface of the calibration pattern substrate 29 at an interval of 1 cm in a longitudinal direction of the standard member for calibration 33 (the x direction) and are V-shaped groove patterns obtained by grinding the substrate section 29 using a dicing blade.

A method of manufacturing the standard member for calibration 13 according to the invention is explained. First, an overview of the method is explained. The method of manufacturing the standard member for calibration 13 includes a step of periodically laminating different members on a substrate surface at a fixed lamination pitch to form a first substrate including a multilayer film, a step of forming first mark patterns consisting of groove patterns at a fixed interval on a second substrate and forming a pair of groove patterns having width larger than the width of the first mark patterns on the outer side of the first mark patterns on the same substrate in a relative positional relation corresponding to the groove patterns and embedding the groove sections with a formed film to planarize the groove sections, a joining step of slicing out the first substrate to be smaller than the second substrate, joining the first and second substrates on the surface side of the multilayer film and a formation surface of the first mark patterns of the second substrate to expose a pair of groove patterns having width larger than the width of the first mark patterns, and forming a joined substrate, a step of forming, at a fixed interval, a linear plurality of groove patterns parallel to the first mark patterns on a surface on the opposite side of the joined surface of the first substrate joined with the exposed pair of grooves patterns, which has the width larger than the width of the first mark patterns of the joined substrate, set as a coordinate reference, a step of forming a sample fragment, a cross-sectional side of which is exposed, a step of matching and bonding the sample fragment and a substrate fragment for retaining the sample fragment, a step of polishing the cross section of the sample fragment, and a step of selectively etching one material of the periodically-laminated multilayer film in the cross-sectional side to form a joined cross-section sample having convexo-concave patterns having a fixed pitch linewidth.

Figure 3:
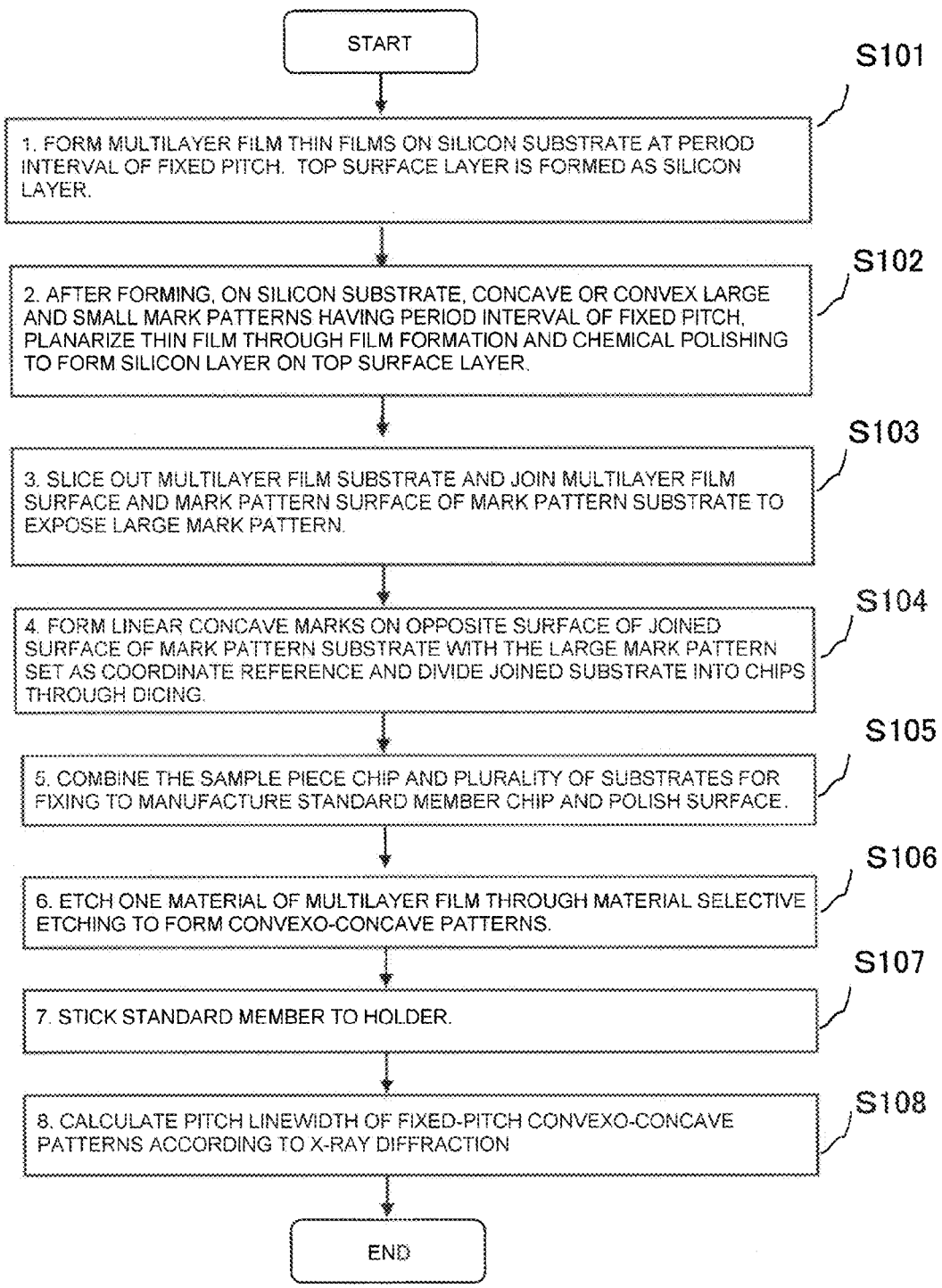
FIG. 3 is a manufacturing process flowchart for the standard member in the first embodiment.

Details of the method of manufacturing the standard member for calibration 13 are explained on the basis of a process flow shown in FIG. 3 and configuration diagrams (FIGS. 1 to 13) related to the process flow.

Figure 4A:
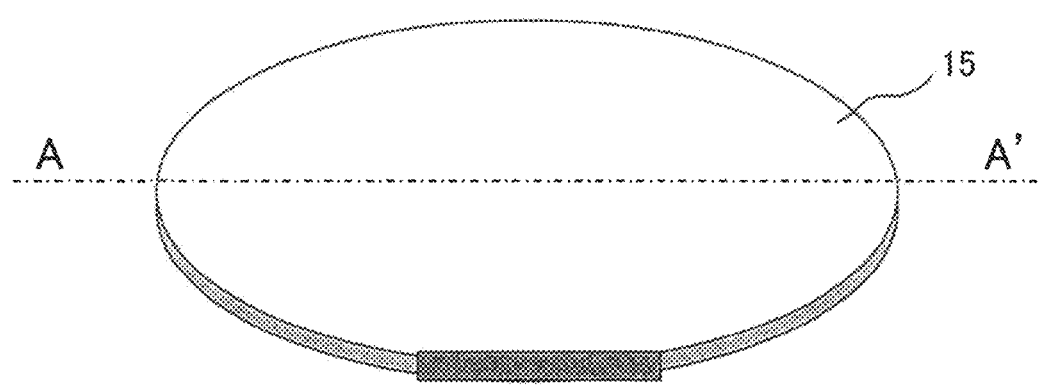
FIG. 4A is a substrate diagram of a wafer for magnification calibration pattern in the first embodiment.
Figure 4B:
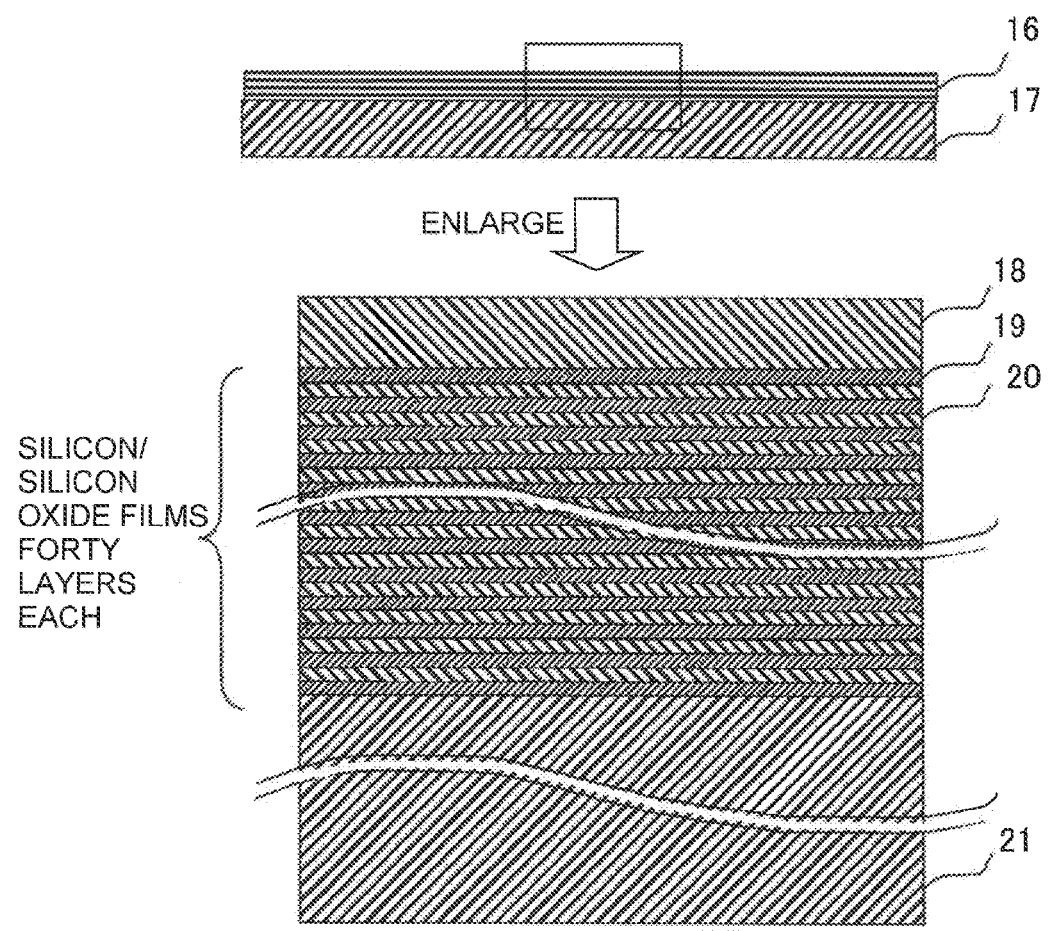
FIG. 4B is an A-A' sectional view and an enlarged view of FIG. 4A.

First, the substrates 15, 17, 21 for the magnification calibration pattern 3 are formed (step S101), FIGS. 4A and 4B are diagrams showing a process for forming a substrate for the magnification calibration pattern 3 from a wafer. FIG. 4A is a perspective view of the silicon substrate 15. FIG. 4B is an A-A' sectional view of FIG. 4A and an enlarged view of a rectangular frame section.

The silicon substrate 15 is obtained by forming, on the silicon substrates 17, 21, forty layers each of a laminated structure of the silicon layer 20 and the silicon oxide film 19 to be a magnification calibration section at thickness of 10 nm of each layer through sputtering film formation. That is, the silicon substrate 15 for the magnification calibration pattern 3 has a laminated structure in which a plurality of the silicon layers 20 having the same thickness and a plurality of the silicon oxide film layers 19 having the same thickness are alternately laminated on the 8-inch silicon substrates 17, 21 having industrial standard thickness of 725 µm. Finally, as shown in the enlarged view of FIG. 4B, a silicon layer 18 is formed as the top layer at thickness of 100 nm by sputtering film formation.

Subsequently, the substrate 22 for a mark pattern is formed (step S102).

Figure 5A:
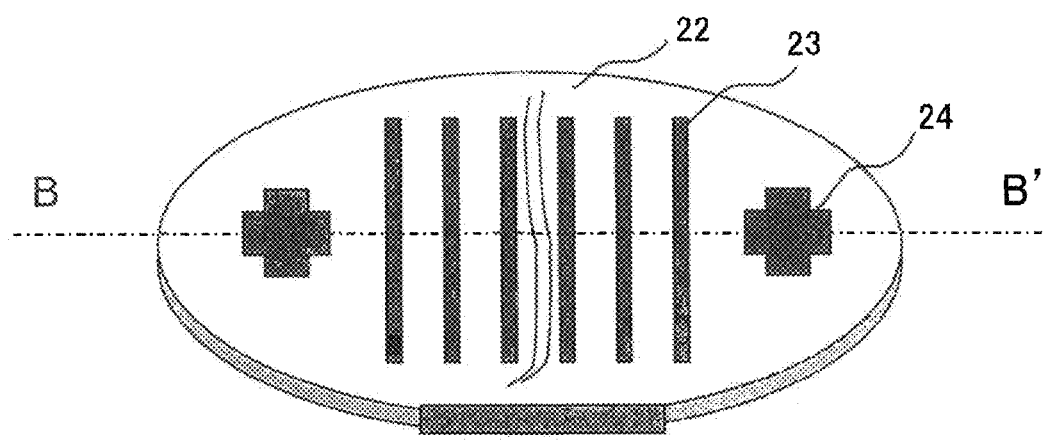
FIG. 5A is a substrate diagram of a wafer for position specifying mark pattern in the first embodiment.
Figure 5B:
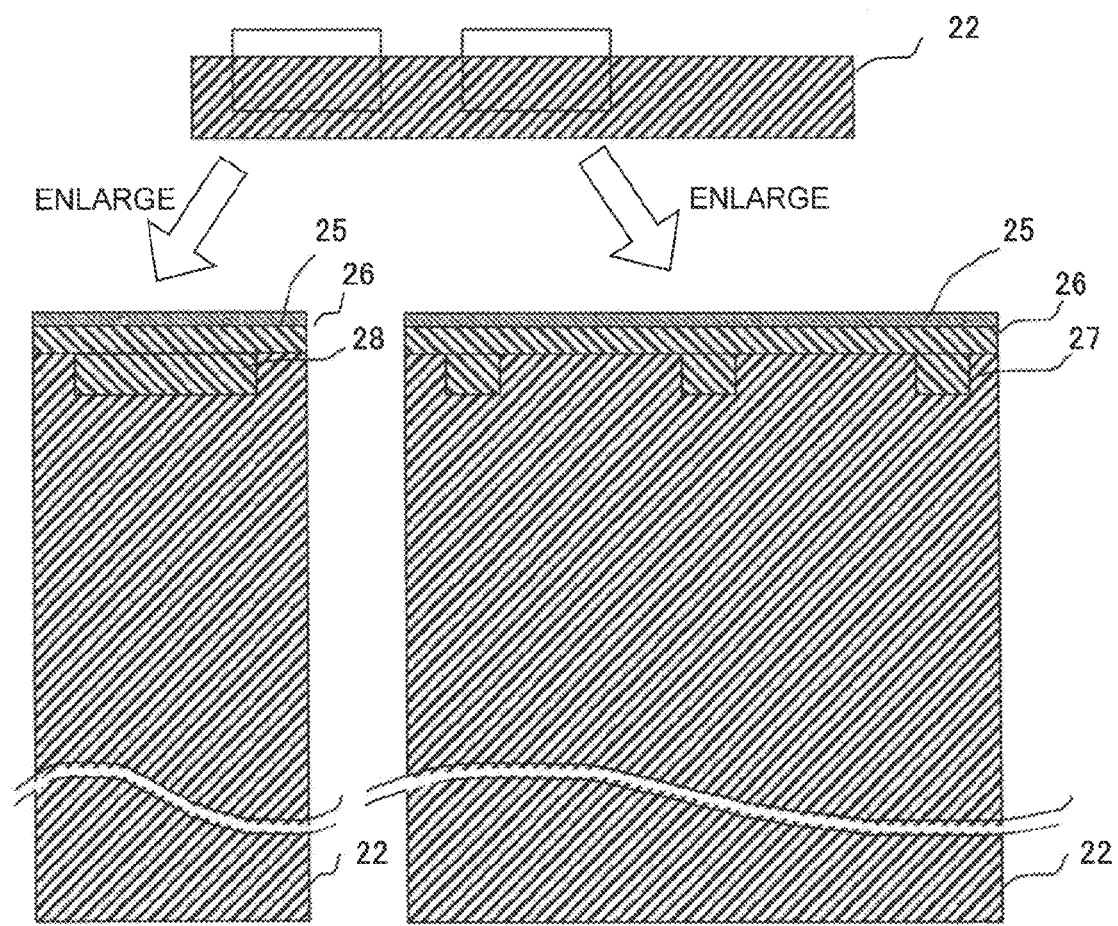
FIG. 5B is a B-B' sectional view and an enlarged view of FIG. 5A.

FIGS. 5A and 5B are diagrams showing a process for creating a substrate for a mark pattern from a wafer. FIG. 5A is a perspective view of the substrate 22. FIG. 5B is a B-B' sectional view of FIG. 5A and an enlarged view of a rectangular frame section. As the groove pattern sections 23, 27 configuring the mark patterns 4, 10, fifty thousand linear groove patterns 23, 27 having width of 0.3 µm and depth of 0.3 µm on the substrate 22 at an interval of 10 µm by lithography and etching. At the same time, on the outer side of the five thousand linear groove patterns having width of 0.3 µm and depth of 0.3 µm, cross-shaped patterns 24, 28 having width of 100 µm and depth of 0.3 µm centering on positions respectively 3 cm apart in the perpendicular direction of the groove patterns from the center positions of the five thousand linear groove patterns are formed by the same lithography and etching. At this point, as a manufacturing error of the center position 23, 27 of the linear groove patterns and the center position of the cross-shaped patterns 24, 28, accuracy equal to or smaller than 0.1 µm was obtained by forming the patterns on the same substrate by the same lithography. After forming an oxide film 26 having thickness of 1 µm over the entire substrate on which these groove patterns are formed, the substrate surface is planarized by chemical mechanical polishing. Thereafter, a silicon layer 25 is formed as the top layer at thickness of 100 nm by sputtering film formation.

Figure 7:
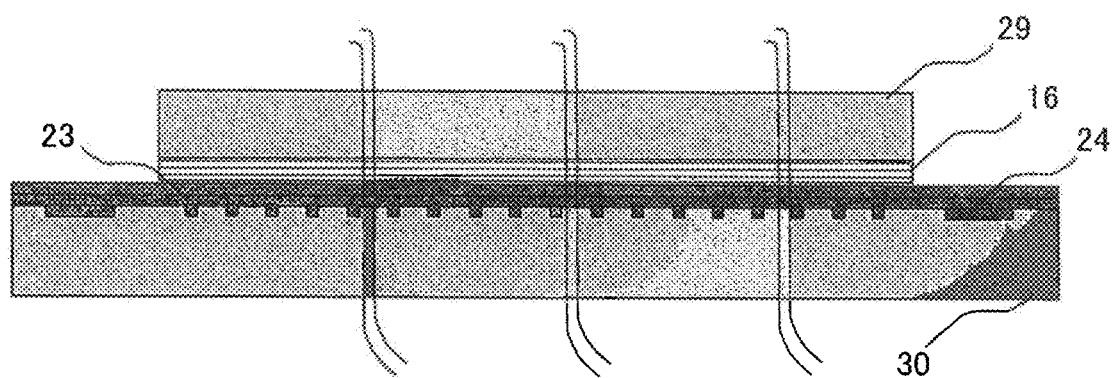
FIG. 7 is a diagram showing a B-B' sectional view of FIG. 6.
Figure 8:
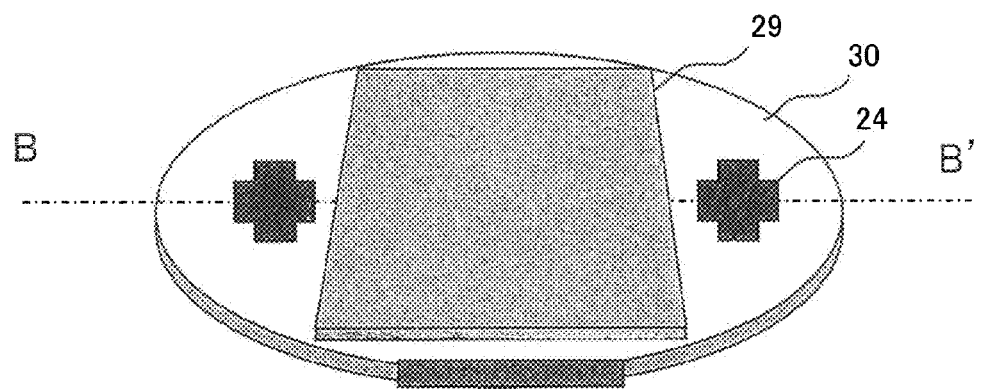
FIG. 8 is a diagram showing wafer joining in the first embodiment.
Figure 9:
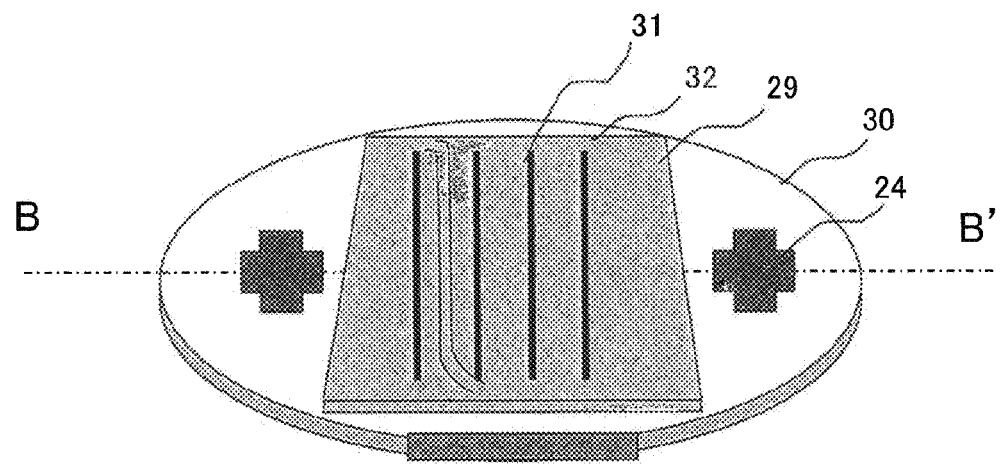
FIG. 9 is a diagram for explaining an example of formation of a position specifying groove pattern on a wafer joined substrate in the first embodiment.
Figure 10:
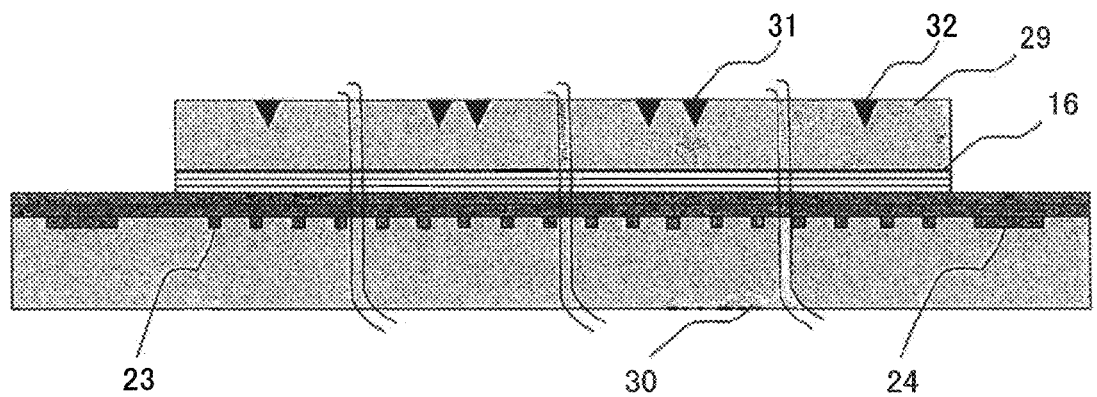
FIG. 10 is a diagram showing a B-B' sectional view of FIG. 9.

Subsequently, the substrate 15 having the laminated structure is sliced out at five angles to form the square substrate 29 and the two substrates 29, 30 are joined (step S103) FIGS. 6 to 9 are diagrams showing a wafer joining method in the first embodiment. FIG. 6 is a perspective view of the two substrates 29, 30. FIG. 7 is a B-B' sectional view of FIG. 6. The two substrates 29, 30 are held such that the two cross marks 24, 28 formed on a mark substrate are exposed as shown in FIGS. 6 to 8 and the laminated structure 16 of the substrates and the surface of the mark pattern 23 are arranged back to back as shown in FIG. 6. Subsequently, the two substrates 29, are stuck together as shown in FIG. 7 by a normal temperature joining process for joining the substrates 29, 30 after activating the substrates 29, 30 with an ion beam in a vacuum.

Subsequently, the linear groove patterns 31, 32 having width of 30 µm and depth of 30 µm are formed by a dicing blade with reference to the respective center positions of the exposed cross marks 24 of the joined substrate. The linear groove patterns 31 and the linear groove patterns 32 are formed as a pair 1 cm apart from each other. A plurality of pairs of groove patterns are formed in parallel to one another. The groove patterns 31, 32 are aligned with reference to the cross marks 24 such that the center position of the groove pattern widths is right above any one of the mark patterns 23 present in the joined surface. A manufacturing error of the center positions of the linear groove patterns 31, 32 is determined by positioning accuracy of dicing. Accuracy equal to or smaller than 1 µm was obtained. Thereafter, sample pieces 34 are sliced out by dicing as shown in FIGS. 11 and 12 with reference to the exposed two cross marks of the joined substrate.

FIG. 11 is a diagram for explaining a manufacturing process for a standard member in the first embodiment. First, the samples 29, 30 stuck together are sliced out into the sample pieces 34 having predetermined width, for example, length of 15 mm and width of 5 mm with reference to the exposed two cross marks 24 (step S104).

Further, as shown in FIGS. 12 and 13, the sliced-out standard member 34 and the substrates for position fixing 6, 7, 8 are stuck together by an adhesive to obtain the standard member 34 of a piece having 15 mm lengthwise and crosswise such that a dicing sliced-out cross section of the sample piece appears on the surface. Since the surface of the standard member 34 to be stuck together is silicon, from the viewpoint of electrical conductivity and flatness and thickness control, the material of the substrates for position fixing 6, 7, 8 is also desirably silicon. Subsequently, the sample piece of the stuck-together standard member is polished such that the height of the cross section of the sample piece is 1.4 mm from the bottom surface of the substrate for position fixing 8 (step S105). The sample piece chip 34 is held by the substrates for position fixing 6, 7 and bonded in a wide area to be placed on the substrate for position fixing 8. Therefore, the standard member chip 34 does not tilt when set and can be stably held. Further, standard member chip 34 functions as a support during polishing. Therefore, polishing efficiency is also improved.

Subsequently, material selective etching is applied to the standard member 34 (step S106). Specifically, the silicon oxide film layer 19 is etched by about 20 nm by selective etching to form line patterns, i.e., periodic convex patterns (magnification calibration patterns 9) of the silicon layer 20. The position specifying marks 4, 10 of an electron microscope are respectively formed as concave patterns on the cross section of the other substrate 2 by selective etching. Further, the pattern position identifying mark patterns 31, 32 for searching for the position specifying marks are provided on the cross section on the opposite side of the joined surface of the silicon substrate 10 in which the multilayer film is formed.

In this way, the silicon substrate 1 including the magnification calibration patterns and the silicon substrate 2 including the position specifying mark patterns are joined. Further, one of the periodic patterns of the diced standard member 34 of the joined substrate is selectively etched. Consequently, the standard member 34 having convexo-concave period pattern of a fixed pitch linewidth is obtained.

As shown in FIG. 2, the etched standard member 34 is embedded in a recess having lengthwise and crosswise length of 1.5 cm and depth of 1.4 mm of the retaining holder 14 having predetermined size, height of 20 mm and a diameter of 20 mm such that the surface of the standard member 34 and the surface of the holder match. The standard member 34 is fixed by, for example, being stuck to the holder using a conductive adhesive to complete a final standard member (step S107). The surface of the retaining holder is designed to match pattern height on a wafer measured by the electron microscope. As a result of securing accuracy by grinding, accuracy equal to or smaller than 10 μm was obtained as an error between the surface and the pattern height on the wafer to be measured.

Subsequently, when diffraction angle measurement by an X-ray diffraction method at wavelength of 0.15 nm was performed for a standard member consisting of the retaining holder mounted with the standard member 34, clear diffracted light up to high order equal to or higher than third order was obtained. A pitch linewidth of 20.01 nm was obtained as a periodic convex pattern (line pattern) period of the silicon layer 20 at a fixed pitch. The pitch linewidth was obtained as an average value of the convexo-concave patterns (line patterns) of the entire surface of the standard member chip 34 on which an X-ray was irradiated during the measurement. The pitch linewidth is acquired (valued) as data for the standard member 8 and stored in a storage device (step S108).

In this embodiment, during magnification calibration of the scanning electron microscope, a horizontal distance of the magnification calibration pattern region 3 and the first position specifying pattern 4 with respect to an incident electron can be set to be equal to or larger than 1 μm and equal to or smaller than 10 μm. As a position accuracy error of the first position specifying patterns 4 and the two pattern position identifying mark patterns 5 for searching for a position specifying mark, accuracy equal to or smaller than 2 μm was obtained.

Since the silicon substrates are joined using joining without the use of an adhesive and with plane directions of the two substrates aligned, a state of a mirror surface in which two substrate surfaces continue in a joined section to be the same as one substrate, in other words, a state in which an interface is absent in the joined surface is obtained. There is no occurrence of a problem in that a part of a superlattice pattern by an adhesive is broken or changes to foreign matters when two substrates are stuck together and formed as in the past.

According to this embodiment, it is possible to arrange the patterns for magnification calibration on a perpendicular cross section and a flat plane, a local surface electric field distribution that occurs in a step section does not occur, and accurate magnification calibration can be performed. The large and small two kinds of position specifying patterns necessary for specifying a calibration place from low magnification to high magnification are provided at an arrangement error with high accuracy. Consequently, it is possible to automatically select a calibration pattern section without electron beam scanning or with a small number of times of electron beam scanning in the past and perform calibration. It is possible to provide a standard member for calibration for highly accurately perform magnification calibration used in the electron microscope. According to this embodiment, it is possible to stably set a calibration error due to automatic calibration within about 0.02 nm.

Second Embodiment

An example in which the standard member 34 including a cross-section sample 1 having the laminated structure of the silicon/silicon oxide film layers manufactured in the first embodiment in the retaining holder 14 is mounted on a scanning electron microscope is explained.

Figure 14:
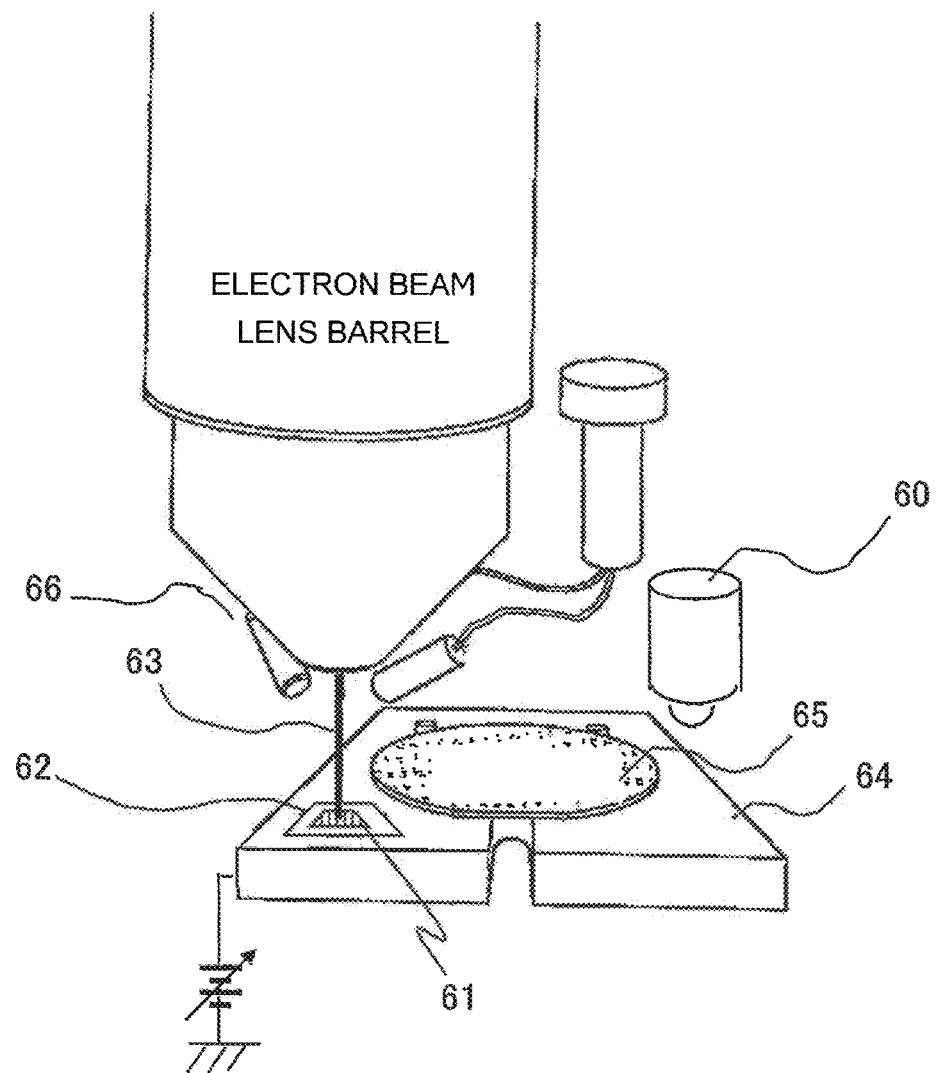
FIG. 14 is a schematic diagram showing a scanning electron microscope applied with a second embodiment.
Figure 15:
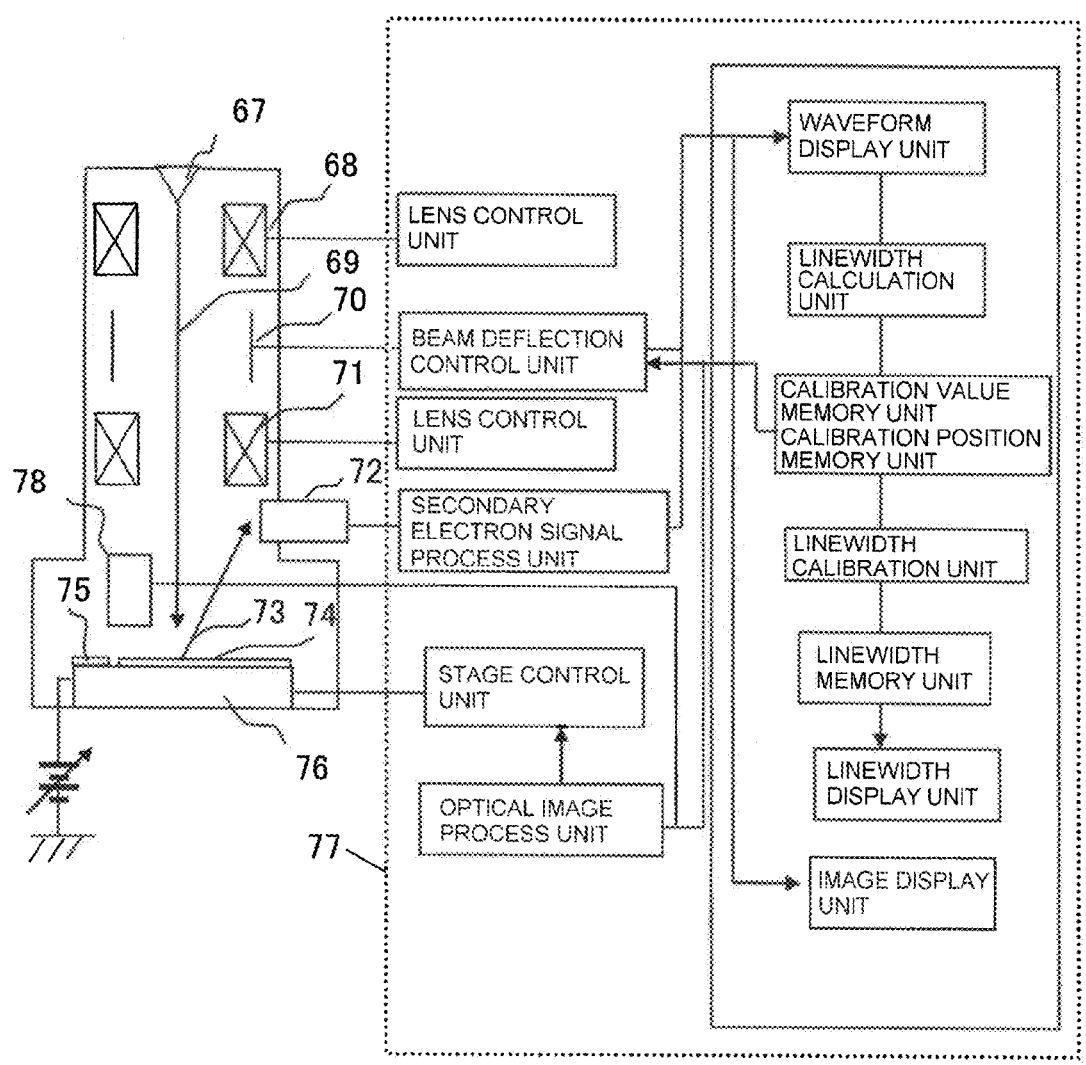
FIG. 15 is a schematic diagram showing a system configuration of the scanning electron microscope applied with the second embodiment.

FIG. 13 is an enlarged perspective view of a stage portion of the scanning electron microscope according to the invention. FIG. 14 is a schematic diagram showing a system configuration of the scanning electron microscope. FIG. 15 is a flowchart in performing magnification calibration of the scanning electron microscope according to the invention.

As shown in FIGS. 14 and 15, in this embodiment, the standard member 34 explained in the first embodiment is mounted on a stage 64 of the scanning electron microscope and calibration of the scanning electron microscope is performed. Note that a measurement sample (a wafer) 65 is stacked and placed on the stage 64. A bias power supply 61 that applies a voltage for controlling an acceleration voltage of a beam 63 is connected to the stage 64. An optical microscope 60 performs measurement position detection at low magnification equal to or lower than one thousand. Reference numeral 66 denotes an electron detector that detects a secondary electron 73 generated by electron beam irradiation.

An overall configuration example of the scanning electron microscope applied with the invention is briefly explained with reference to FIG. 15. The scanning electron microscope includes an electron gun (a electron source) 67 configured to emit the electron beam 63, a scanning deflector 70 for scanning the electron beam 63 on a sample, lenses 68, 71 for adjusting a focus of an electron beam on a sample to be measured 65, an astigmatism corrector 74, an electron detector 72 for detecting the secondary electron 73 generated by primary electron beam irradiation, and an SEM control system including an information processing device. The SEM control system 77 is configured by, for example, a lens control unit 251 configured to control the lens 68, a beam deflection control unit 252 configured to control scanning deflection of the primary electron beam, a lens control unit 253 configured to control the lens 71, a secondary electron signal processing unit 254 configured to process an output signal from the electron detector 72, a controller 2250 configured to control the astigmatism corrector 74, a stage control unit 255 configured to control the movement of the stage on which the sample to be measured 65 or the standard member 8 is placed, an optical microscope 78 for specifying a sample observation position at low magnification, a stage for moving a measurement position specified from an optical image into an electron beam deflection region, and an optical image processing unit configured to perform electron beam deflection position control. An information processing device 260 configuring the SEM control system 77 is configured by, for example, an arithmetic processing unit (a linewidth calculation unit and a linewidth calibration unit) by a CPU for subjecting various kinds of information and control signals input from an SEM control unit to arithmetic processing, a memory (not shown in the figure) in which various kinds of software for magnification calibration processing and the like operating on the CPU are expanded, and an external storage device (a calibration value memory unit, a calibration position memory unit, and a linewidth memory unit) in which information such as measurement recipe and various kinds of software are stored. Further, a display unit (a waveform display unit, a linewidth display unit, and an image display unit) on which an information processing result by the CPU is displayed, information input means (not shown in the figure) for inputting information necessary for information processing to an information processing device, and the like are connected to the information processing device 77.

The operation of the scanning electron microscope is briefly explained. The electron beam 63 emitted from the electron gun (the electron source) 67 is scanned on a sample by the lenses 68, 71 and the deflector 70. The measurement sample (the wafer) 65 is present on the stages 64, 76. A voltage is applied to the stage 64 to control a beam acceleration voltage. A position coordinate reference mark formed in a sample observation position or on the sample is observed by the optical microscope 78 at low magnification and specified by the optical image processing unit. A measurement position specified from an optical image is stored in advance. Tilts of a coordinate system and a stage coordinate system in a horizontal plane of the sample are stored in advance in the optical image processing unit. A measurement place is moved into the electron beam deflection region according to the stage or electron beam deflection position control on the basis of the measurement position specified from the optical image or a coordinate of the position coordinate reference mark. Display and measurement of a secondary electron (or reflected electron) image and a secondary electron signal waveform are performed on the basis of signals from the electron detectors 66, 72 configured to detect the secondary electron 73 generated by electron beam irradiation on the sample to be measured. A stage position at that point is detected and controlled by the stage control unit. In FIG. 15, the calculation units, the control unit, the display unit, and the like are included in the information processing device 77. However, the units do not always have to be included in the information processing device 77.

Figure 16:
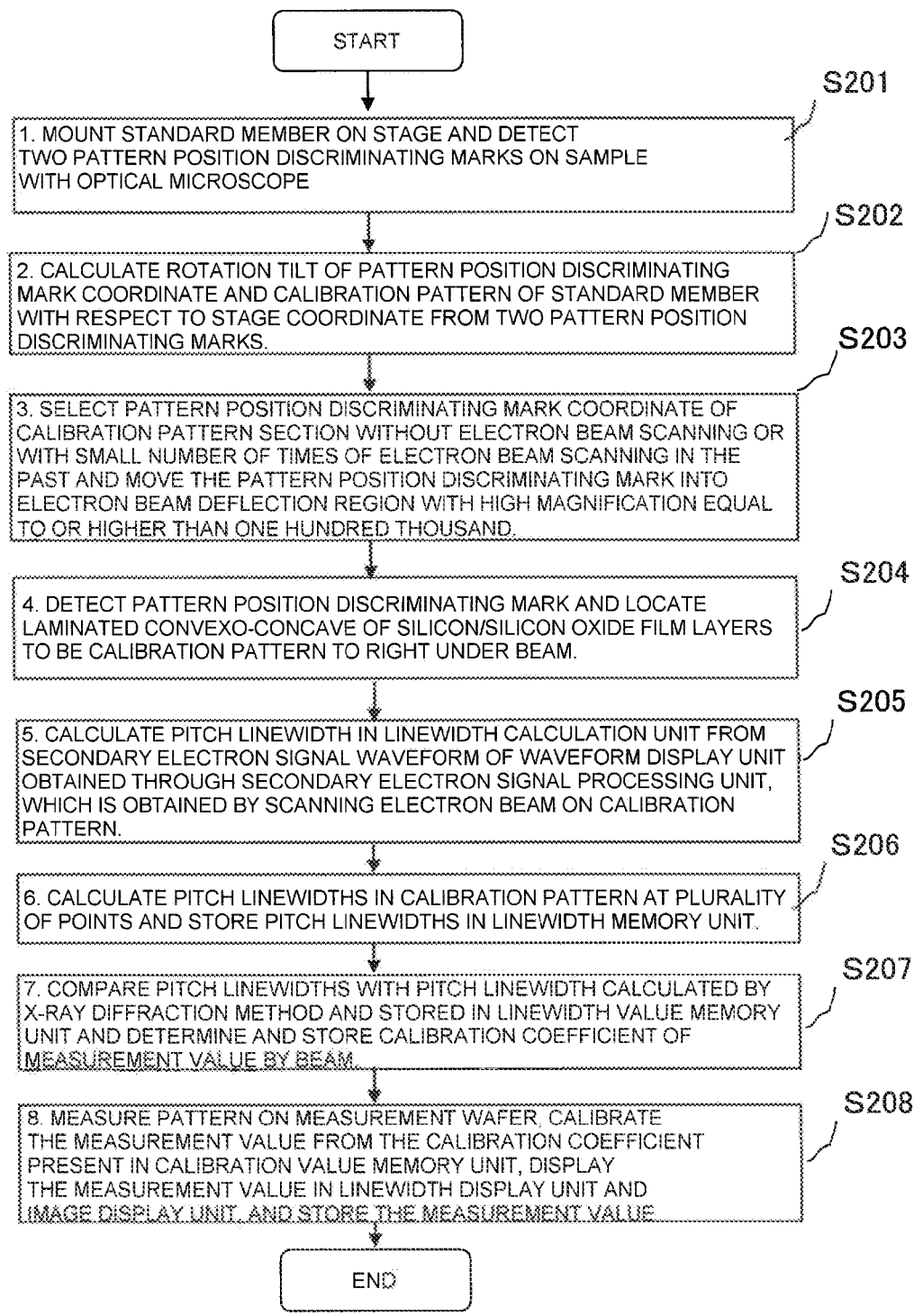
FIG. 16 is a flowchart in performing magnification calibration of the scanning electron microscope according to the second embodiment.

A procedure of processing for performing magnification calibration according to the invention is explained according to a flowchart of FIG. 16. First, a standard member including the laminated convexo-concave structure cross-section samples 34, 61 of the silicon/silicon oxide film layers manufactured in the first embodiment in the holders 14, 62 is mounted on the stage 64. The standard member is moved to under the optical microscope 78 by the stage 64. The two pattern position discriminating marks 31, 32 on the sample are detected at first predetermined magnification, for example, low magnification of two hundred times (step S201). A position error of the pattern position discriminating marks 31, 32 of the standard member 34 included in the holder 14 with respect to the stage is about 0.5 mm. However, since groove width is fit within a visual field of 1 mm at the low magnification of two hundred times and the size of the groove width is as large as 30 µm, the size in the visual field is sufficiently recognizable size of 6 mm at the magnification of two hundred times. The two pattern position discriminating marks 31, 32 are deep groove patterns. Therefore, contrast of an optical image is high. A mark detection ratio in the optical image processing unit is equal to or higher than 90%. Further, the multilayer film and the two pattern position discriminating marks 31, 32 form both-side polished substrate as the substrate 17 on which the deep groove patterns are formed. Therefore, the surface on which the pattern position discriminating marks 31, 32 are formed is also a polished surface. Unevenness of the substrate rear surface is usually about 1 µm. When the surface is formed as the polished surface, the unevenness is reduced to be equal to or 1 µm. Therefore, a discrimination ratio of the pattern position discriminating marks 31, 32 having depth and groove width of 30 µm on the cross section was further improved to be equal to or higher than 99%. By forming a groove shape of the pattern position discriminating marks 31, 32 as a V shape, it is possible to easily detect a vertex portion of a V shape as a reference coordinate.

Subsequently, a rotation tilt of a pattern position discriminating mark coordinate and a calibration pattern of the standard member with respect to a stage coordinate is calculated from the two pattern position discriminating marks (step S202). The rotation tilt of the coordinate system of the stage and the two pattern position discriminating marks was 0.5 degree in the clockwise direction. A rotation error in the case in which the holder 60 is fixed to the stage occurs about 1 degree. The rotation error is different every time the holder is fixed. Subsequently, a pattern position discriminating mark coordinate of a calibration pattern section without electron beam scanning or with a small number of times of electron beam scanning in the past is calculated from the rotation tilt of the pattern position discriminating mark coordinate and the calibration pattern of the standard member with respect to the stage coordinate. The pattern position discriminating mark of the calibration pattern section without electron beam scanning in the past or with a small number of times of electron beam scanning in the past is moved into an electron beam deflection region with high magnification equal to or higher than one hundred thousand by stage movement (step S203). A rotation error of the pattern position discriminating mark and the pattern position discriminating mark at this point is 0 degree because the pattern position discriminating marks are formed on the same position substrate. A position error is equal to or smaller than a grinding position error of 1 µm during dicing. Therefore, when an electron beam was scanned on the standard member 8 at magnification of one hundred thousand times, a specific pattern position discriminating mark was able to be grasped in a visual field of 2 µm by electron beam scanning. Since the pattern position discriminating marks adjacent to each other are arrayed at a pitch of 10 µm, the adjacent pattern position discriminating mark is not detected. When the pattern position discriminating mark of the calibration pattern section without electron beam scanning in the past is designated, a pattern position discriminating mark not registered in a calibration position memory unit of an external memory unit only has to be selected.

In this way, it is possible to automatically specify, without fail, the pattern position discriminating mark beam of the calibration pattern section without electron beam scanning in the past. When the pattern position discriminating mark is detected, an electron beam deflection center is moved to a calibration pattern section present in a position a fixed distance (assumed to be 1.5 µm) apart from the mark by the stage or electron beam deflection. A voltage of minus 1.5 kV is applied to the stage 64 to set an acceleration voltage of an electron beam in this calibration to, for example, 500 V. In this way, the laminated convexo-concave 14 of the silicon/silicon oxide film layers is located right under the beam by a stage control unit and an electron beam deflection control unit in the procedure explained above (step S204). The pattern position discriminating mark coordinate used for the calibration is stored in the storage device in advance.

A pitch linewidth was calculated in the linewidth calculation unit from a secondary electron signal waveform of the waveform display unit obtained through the secondary electron signal processing unit, which was obtained by scanning an electron beam on the calibration pattern of the laminated convexo-concave of the silicon/silicon oxide film layer of the fixed pitch linewidth (step S205). The measurement was repeated at twenty points in different positions of the calibration patterns 9 of the laminated convexo-concave of the silicon/silicon oxide film layer of the fixed pitch linewidth. Subsequently, an average value 20.10 nm of pitch linewidths at the twenty point obtained by the measurement was stored in a linewidth value memory unit (step S206). Subsequently, the pitch linewidth calculated in the linewidth calculation unit by the linewidth calibration unit and the pitch linewidth 20.01 nm calculated by the X-ray diffraction method in advance and stored in the linewidth value memory unit were compared to determine a calibration coefficient of a measurement value by a beam. The beam deflection control unit was corrected to set a difference between the pitch linewidths to 0 and the calibration coefficient was stored in the calibration value memory unit (step S207).

On the other hand, the sample stage 64 was driven to measure a pattern on the measurement wafer 65, the measured value was calibrated from the calibration coefficient present in the calibration value memory unit, displayed in the linewidth display unit and the image display unit, and stored (step S208).

The surface of the holder 14 and the surfaces of the two laminated cross-sectional structures 13 of the silicon/silicon oxide film layers were substantially the same planes with a step equal to or smaller than 1 μm. Therefore, there was no disorder of a surface electric field due to a voltage of −1.5 kV applied to the stage and calibration accuracy equal to or smaller than 0.02 nm was obtained. There was likelihood of linewidth fluctuation due to contamination adhesion in a calibration section on which a beam was irradiated. Therefore, in the next opportunity of calibration, since a position coordinate of a position specifying mark near the calibration section used for the calibration was stored during the calibration, even when the standard member was removed or a coordinate origin of the stage deviated, stable apparatus calibration was always able to be performed by using an unused calibration pattern on the basis of this coordinate.

On the other hand, in the case of the standard member of the related art, since a position specifying mark detectable at magnification of several hundred times was absent, calibration position specification sufficient for automatic measurement was not able to be performed. Therefore, when a stage absolute coordinate fluctuates because of drift or, immediately after a calibration sample is mounted or when the calibration sample is mounted again after being once removed, a person needs to register again a position specifying mark that is detected at magnification of several ten thousand times. In this method, even if a calibration position once used is registered, the calibration position cannot be distinguished from an adjacent position specifying mark because of wrong designation of a position specifying mark or stage coordinate fluctuation. Therefore, management of a calibration place is indefinite.

According to the embodiment of the invention, it is possible to arrange the pattern for magnification calibration and the large and small two kinds of position specifying marks on a flat plane, a local surface electric field distribution that occurs in the step section does not occur, and accurate magnification calibration and specification of a calibration place can be performed. Therefore, it is possible to highly accurately perform magnification calibration used in the electron microscope. Further, since the large and small two kinds of position specifying marks can be arranged on the opposite surfaces of the substrate, a large number of small position specifying mark patterns can be arrayed without being limited to an arrayed region of the small position specifying mark pattern. Therefore, it is possible to increase the number of calibration places that can be specified.

Note that the standard member according to the invention is not limited to the scanning electron microscope shown in FIG. 14. It goes without saying that the standard member can be applied to other electron beam apparatuses.

Third Embodiment

Figure 17:
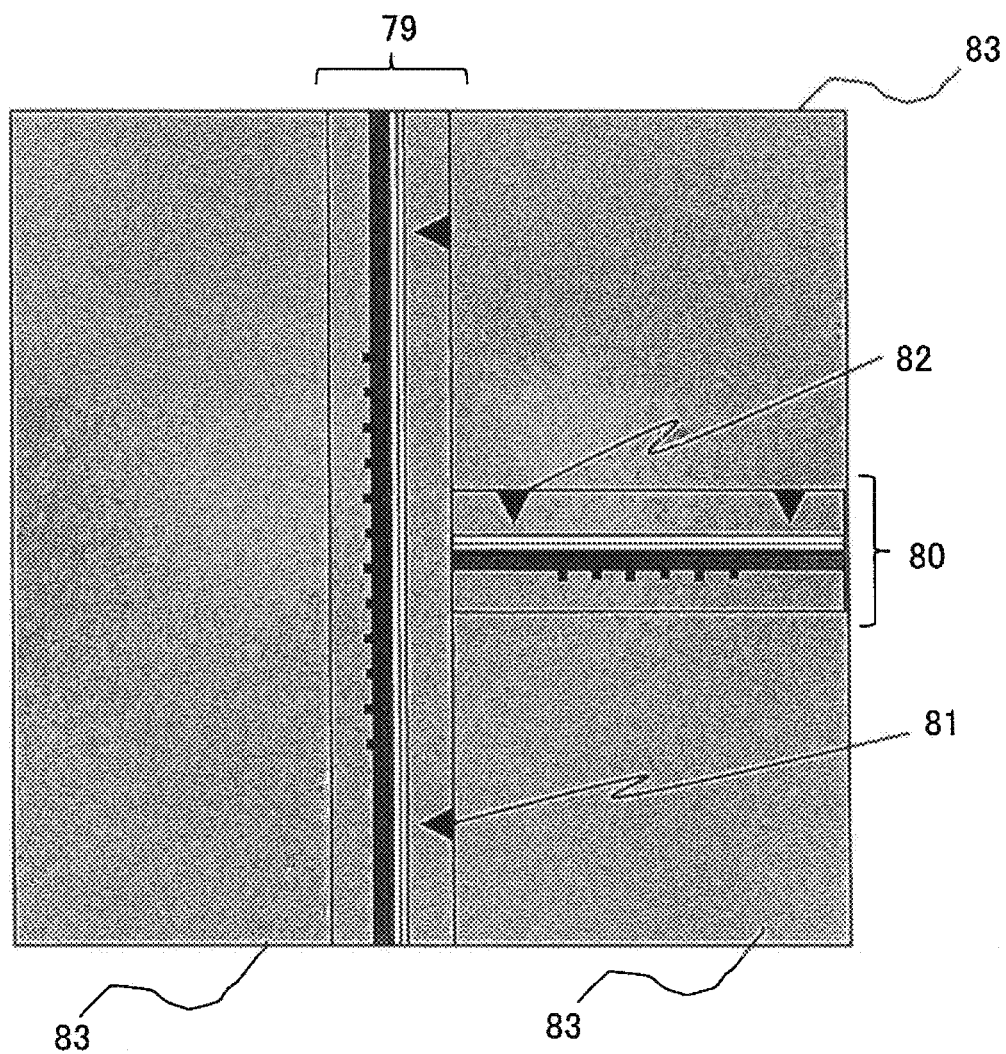
FIG. 17 is a schematic diagram of a standard member according to a third embodiment of the invention.
Figure 18:
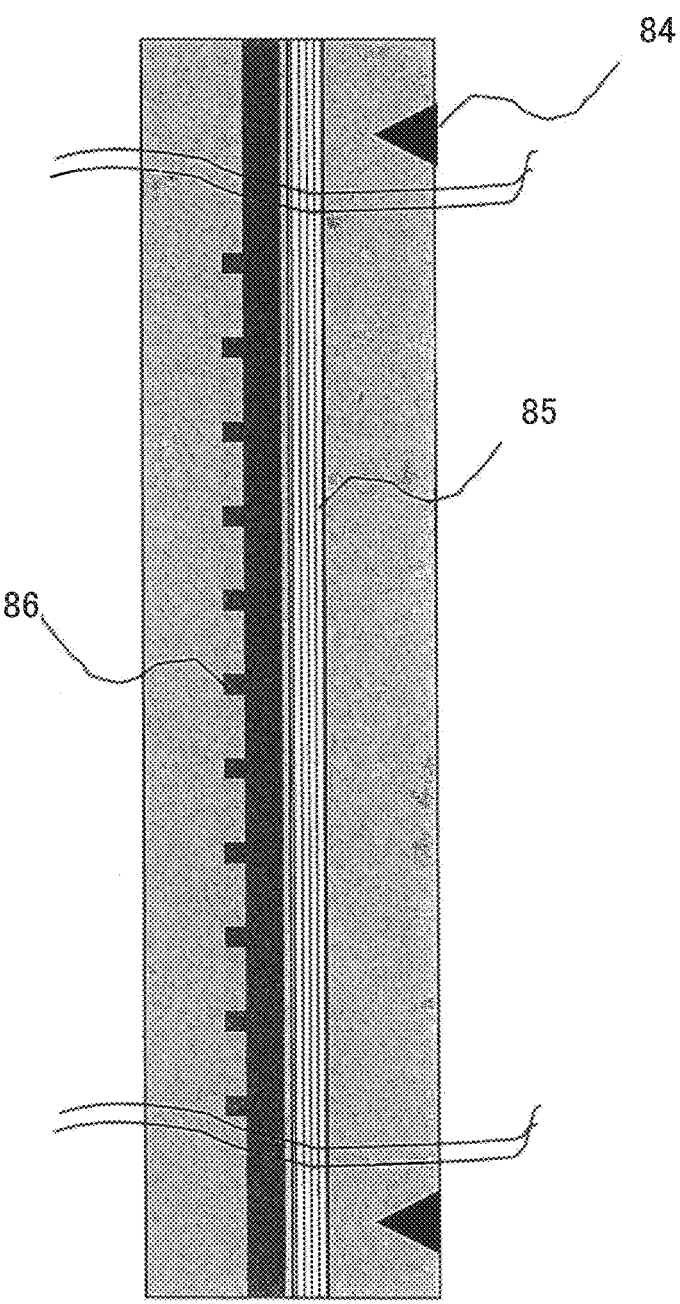
FIG. 18 is a sectional enlarged view of an example of a calibration member chip shown in FIG. 17.

In the embodiments explained above, the example in which the standard member includes the calibration pattern in only one direction is explained. However, as patterns observed by an electron microscope, there are lengthwise and crosswise patterns represented by a semiconductor device. Therefore, when the lengthwise and crosswise patterns are measured, a standard member including calibration patterns in lengthwise and crosswise directions is necessary. An example of the standard member including the calibration patterns in the lengthwise and crosswise directions is shown in FIG. 17. Two sample pieces 79, 80 sliced out at lengths of 15 mm and 10 mm shown in FIG. 18, which are manufactured using a manufacturing method same as the manufacturing method in the first embodiment, and a retaining substrate 83 are stuck together by an adhesive to be a standard member of a piece having 15 mm lengthwise and crosswise such that a dicing sliced-out cross section of the sample piece appears on the surface and the two sample pieces 79 and 80 are orthogonal to each other. The sample piece of the stuck-together standard ember is polished such that the height of the cross section of the sample piece is at 1.4 mm from the bottom surface of the substrate for position fixing 8.

Subsequently, material selective etching is applied to a standard member chip to form periodic convex patterns (magnification calibration patterns) as in the first embodiment. Position specifying marks of the electron microscope are respectively formed as concave patterns on the cross section of the other substrate 2 by selective etching. Further, pattern position identifying mark patterns 81 and 82 for searching for a position specifying mark are respectively provided on the cross section on the opposite side of a joined surface of a silicon substrate in which a multilayer film is formed.

Subsequently, a holder stuck with a standard member chip, in which pitches of lengthwise and crosswise periodic convex patterns (magnification calibration patterns) arranged to be orthogonal to each other are respectively measured using an X-ray as in the first embodiment, is mounted on the stage 64 as in the first embodiment. Magnification calibration of an electron beam apparatus is performed using the magnification calibration patterns on the sample piece 79 in a procedure same as the procedure in the first embodiment. As the calibration in this case, magnification calibration of electron beam deflection in a direction perpendicular to the magnification calibration pattern is possible. Therefore, highly accurate measurement can be performed for a measurement pattern in a direction same as the direction of a calibration pattern. However, the same highly accurate pattern measurement can be performed for a pattern orthogonal to the calibration pattern by performing magnification calibration of the electron beam apparatus using the magnification calibration patterns on the sample piece 80 in the crosswise direction. The calibration by the magnitude calibration patterns on the sample piece 80 in the crosswise direction is performed in a procedure explained below same as the procedure of the calibration by the magnification calibration patterns on the sample piece 79 in the lengthwise direction. The standard member is moved to under the optical microscope 78 by the stage 64. Two pattern position discriminating marks 84 on the sample are detected at first predetermined magnification, for example, low magnification of two hundred times. As assembly accuracy of the sample piece 80 in the crosswise direction to the sample piece 79 in the longitudinal direction, rotation of about 1 degree occurs with respect to 90 degrees at which the sample piece 80 is orthogonal to the sample piece 79. However, the pattern position discriminating mark of the standard member included in the holder 14 was able to be sufficiently recognized at magnification of two hundred times and a mark detection ratio was equal to or higher than 90%. Subsequently, a rotation tilt of the calibration pattern of the sample piece 80 in the crosswise direction with respect to a stage coordinate was calculated from the pattern position discriminating mark of the sample piece 80 in the crosswise direction. A pattern position discriminating mark coordinate 86 of a calibration pattern section without electron beam scanning or with a small number of times of electron beam scanning in the past was calculated from the pattern position discriminating mark coordinate and the rotation tilt of calibration pattern 85 of the standard member with respect to the stage coordinate. A pattern position discriminating mark of the calibration pattern section without electron beam scanning or with a small number of times of electron beam scanning in the past was moved into an electron beam deflection region of high magnification equal to or larger than one hundred thousand by stage movement Subsequently, the calibration pattern was located right under a beam and magnification calibration was performed. Consequently, calibration accuracy equal to or lower than 0.02 nm was obtained for both the lengthwise and crosswise patterns.

Figure 19:
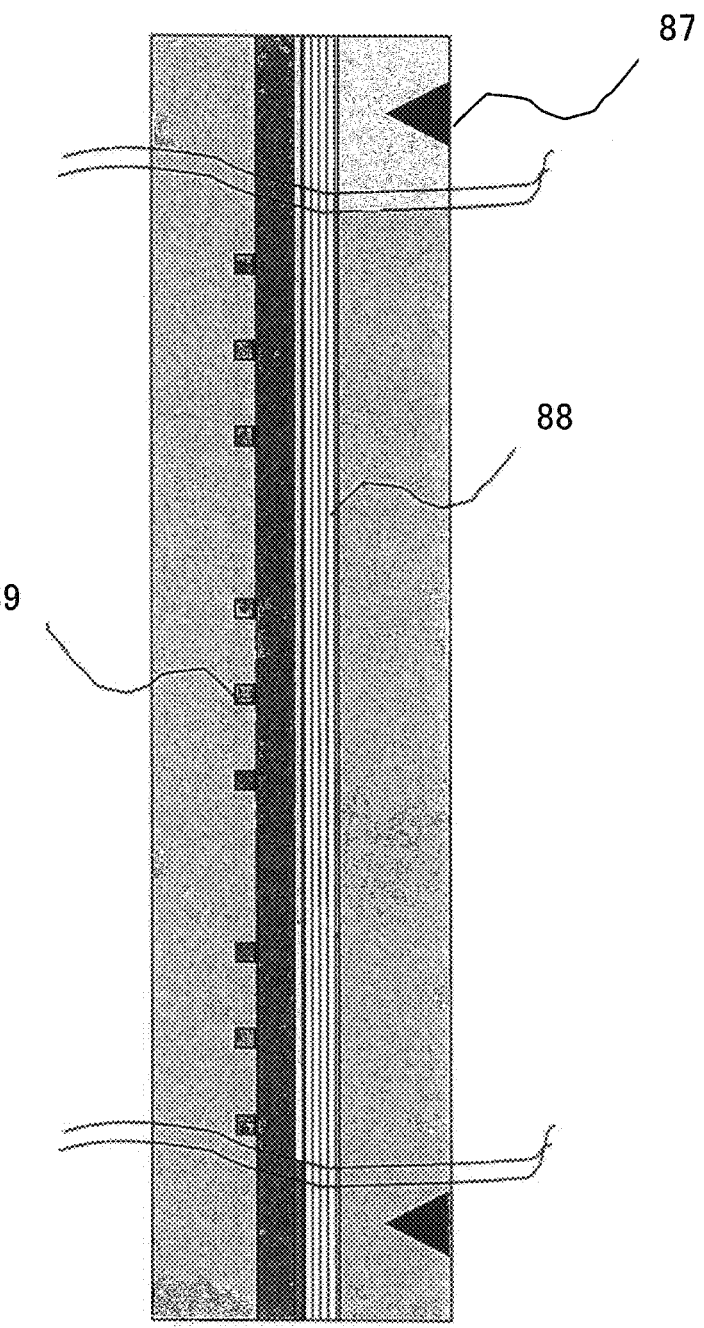
FIG. 19 is a sectional enlarged view of an example of the calibration member chip shown in FIG. 17.

Stage position accuracy of the electron beam apparatus used in the above example is equal to or lower than 7 μm. Therefore, since the pattern position discriminating marks adjacent to each other are arrayed at a pitch of ±10 μm, the adjacent pattern position discriminating mark is not detected. However, in an electron beam apparatus having stage position accuracy equal to or higher than 10 μM, it is likely that a pattern position discriminating mark adjacent to a target pattern position discriminating mark is detected by mistake. Therefore, in order to solve the problem, a pattern position discriminating mark array shown in FIG. 19 is used. Pitch linewidths of a calibration pattern 88 of a sample piece and pattern position discriminating marks (second mark patterns) 87 are the same each other. However, as a pattern array of pattern position discriminating marks (first mark patterns) 89, three adjacent patterns continuously arrayed at a pitch of ±10 μm are set as a pattern group. Pattern groups are arrayed at a pitch of 40 μm. Therefore, even in the electron beam apparatus having stage position accuracy of 20 μm, a pattern group is not detected by mistake. Abeam is moved to a specific pattern position discriminating mark in the group by electron beam deflection. Since beam deflection accuracy is equal to or lower than 1 μm, highly accurate calibration was possible even in an electron beam apparatus having low stage position accuracy.

REFERENCE SIGNS LIST

1, 11, 29 Multilayer film substrates (First substrates)
2, 12, 22, 30 Mark forming substrates (Second Substrates)
3 Calibration pattern
4, 5, 10, 86, 89 Mark patterns
6, 7, 8, 83 Substrates for fixing
9, 16, 37, 85, 88 Laminated structure sections
13 Standard member for calibration
14, 62 Retaining holders
15, 17, 21, 22 Substrates
19, 26 Silicon oxide film layers
18, 20, 25 Silicon layers
23, 27, 31, 32, 81, 82, 84, 87 Mark patterns (Groove patterns)
24, 28 Cross patterns
33, 79, 80 Sample pieces
34, 61, 75 Standard members
60, 78 Optical microscopes
67 Electron gun
63, 69 Electron beams
68, 71 Lenses
70 Deflector
64, 76 Stages
65, 74 Measurement wafer samples
66, 72 Detectors
73 Secondary electron or reflection electron
77 Information processing apparatus

The invention claimed is:

1. A standard member for calibration for calibrating a scanning electron microscope, comprising:
    a multilayer film cross section formed by alternately laminating materials different from each other;
    a plurality of first mark patterns arranged across a first silicon layer and in parallel to the multilayer film cross section;
    at least a pair of second mark patterns arranged across a second silicon layer thicker than the first silicon layer on an opposite side of the first mark patterns with respect to the multilayer film cross section and in parallel to the multilayer film cross section; and
    a silicon layer arranged on an outer side of the first mark patterns and the second mark patterns with respect to the multilayer film cross section,
    the multilayer film cross section, the first mark patterns, the second mark patterns, and the silicon layer being provided on the same plane.

2. The standard member for calibration according to claim 1, wherein
    the multilayer film cross section is a magnification calibration pattern region,
    the first mark patterns are concave-shape reference marks for detecting a position of the magnification calibration pattern region, and
    the second mark patterns are concave-shape reference marks for detecting the first mark patterns.

3. The standard member for calibration according to claim 1, wherein
    the multilayer film cross section and the second mark patterns are formed on a first substrate,
    the first mark patterns are formed on a second substrate,
    the multilayer film cross section side, which is a surface of the first substrate, and the first mark pattern side, which is a surface of the second substrate, are joined, and
    the silicon layer located on the outer side of the first mark patterns and the second mark patterns with respect to the multilayer film cross section is a silicon substrate that fixes the joined substrate.

4. The standard member for calibration according to claim 3, wherein the first substrate and the second substrate are joined by direct joining by normal temperature joining.

5. The standard member for calibration according to claim 3, wherein the sample cross section is a cross section formed by dicing and polishing.

6. The standard member for calibration according to claim 3, wherein the first substrate and the second substrate are a combination of single crystal substrates containing silicon or a combination of amorphous substrates containing silicon.

7. The standard member for calibration according to claim 3, wherein the surface of the first substrate and the surface of the second substrate are silicon layers.

8. The standard member for calibration according to claim 3, wherein
    the multilayer film cross section is a multilayer film cross section formed by convexo-concave patterns obtained by laminating silicon and silicon oxide films on a substrate surface at a predetermined lamination pitch and selectively etching one material, and
    the first mark patterns are silicon groove patterns periodically formed at a predetermined pitch in a direction horizontal to a cross section and formed in a direction perpendicular to the cross section, a silicon oxide film being formed on the first mark patterns.

9. The standard member for calibration according to claim 8, wherein the plurality of first mark patterns are grouped for each predetermined number, and the groups are arranged at a predetermined interval.

10. The standard member for calibration according to claim 9, wherein the predetermined interval of the groups is integer times of a pitch linewidth for the each predetermined number.

11. The standard member for calibration according to claim 3, wherein a standard member for calibration is configured by combining at least a pair or more of the joined substrates of the first substrate and the second substrate joined on a surface of the multilayer film, and the pair of joined substrates are arrayed at a right angle each other and cross in a center of the standard member for calibration.

12. A method of manufacturing a standard member for calibration for calibrating, from information concerning secondary electron or reflection electron intensity generated by scanning an incident electron beam in an observation region on a measurement sample, a scanning electron microscope that measures a pattern in the observation region, the method comprising:
a step of alternately laminating materials different from each other on a first silicon substrate surface to manufacture a first substrate, which is a multilayer film cross section on which a silicon layer is formed as a top layer;
a step of forming a plurality of groove patterns, which are first mark patterns, on a second silicon substrate surface, forming a cross-shaped groove pattern, which is a third mark pattern, on an outer side with respect to a row of the groove patterns, and, after forming an oxide film over the entire second silicon substrate surface, manufacturing a second substrate that forms a silicon layer as a top layer;
a step of slicing out the first substrate into size smaller than the second substrate and joining the silicon layer, which is the top layer of the first substrate, the silicon layer, which is the top layer of the second substrate, such that the third mark pattern is exposed;
a step of forming a plurality pairs of groove patterns, which are second mark patterns, on the first substrate side of the joined substrate with reference to a position of the third mark pattern;
a step of slicing out the joined substrate with reference to the position of the third mark pattern;
a step of erecting the multilayer film cross section, the first mark patterns, and the second mark patterns of the sliced-out joined substrate on a substrate for position fixing to appear on an upper surface and sticking together the first silicon substrate surface and the second silicon substrate to be held by retaining substrates made of silicon from both sides;
a step of polishing a cross section of a stuck joined substrate to set height of the cross section of the stuck joined substrate to desired height from a bottom surface of the substrate for position fixing; and
a step of forming a line pattern through material selective etching of the cross section of the joint substrate and forming the first mark patterns, which are position specifying patterns, as convexo-concave patterns through the material selective etching.

13. The method of manufacturing the standard member for calibration according to claim 12, wherein, in the joining step, a discontinuous boundary of a top surface atom array and atmosphere extending across the atmosphere before the joining in an atom array state of the surfaces of two opposed substrates disappears after the joining and the atom array state of top surfaces of the two opposed substrates changes to a continuous atom array state.

14. The method of manufacturing the standard member for calibration according to claim 12, wherein, in the step of slicing out the joined substrate, a cross section is formed by dicing.

15. The method of manufacturing the standard member for calibration according to claim 12, wherein the second mark patterns are manufactured by dicing in a direction perpendicular to at least a pair of the cross sections.

16. A scanning electron microscope comprising:
a sample stage configured to retain a sample or a standard member for calibration;
an irradiation optical system configured to scan an electron beam on the sample on the sample stage;
a detector configured to detect a second electron or a reflection electron generated by the scanning of the electron beam;
signal processing means for measuring the sample by processing an electron signal obtained from the detector;
display means on which a measurement result is displayed;
a bias power supply configured to apply a voltage for controlling an acceleration voltage of the electron beam to the sample stage; and
a calibration function for performing magnification calibration of the irradiation optical system from information concerning intensity of the secondary electron or the reflection electron on the standard member for calibration mounted on the sample stage,
the scanning electron microscope measuring, from the information concerning intensity of a secondary electron or a reflection electron generated by scanning an incident electron beam on an observation region on the measurement sample, a pattern in the observation region, wherein
the standard member for calibration includes:
a multilayer film cross section formed by alternately laminating materials different from each other;
a plurality of first mark patterns arranged across a first silicon layer and in parallel to the multilayer film cross section;
at least a pair of second mark patterns arranged across a second silicon layer thicker than the first silicon layer on an opposite side of the first mark patterns with respect to the multilayer film cross section and in parallel to the multilayer film cross section; and
a silicon layer arranged on an outer side of the first mark patterns and the second mark patterns with respect to the multilayer film cross section,
the multilayer film cross section, the first mark patterns, the second mark patterns, and the silicon layer being provided on the same plane.

17. The scanning electron microscope according to claim 16, wherein
an interval of the first mark patterns is calculated in advance according to light or X-ray diffraction, and
the scanning electron microscope comprises a function of comparing a pitch linewidth of any one of the mark patterns calculated by the signal processing means and a pitch linewidth calculated in advance according to the light or X-ray diffraction and performing magnification calibration of the irradiation optical system to reduce a difference between the pitch linewidths to nearly zero.

18. The scanning electron microscope according to claim 16, further comprising:

an optical microscope configured to detect the second mark patterns;
a function of detecting the first mark patterns through electron beam scanning on the basis of coordinate information of the second mark patterns and storing the coordinate information; and
a function of performing magnification calibration of the calibration member.

* * * * *